(12) United States Patent
Kwak et al.

(10) Patent No.: US 8,324,004 B2
(45) Date of Patent: Dec. 4, 2012

(54) METHOD FOR MANUFACTURING OF LIGHT EMITTING DEVICE USING GAN SERIES III-V GROUP NITRIDE SEMICONDUCTOR MATERIAL

(75) Inventors: Joon-seop Kwak, Kyungki-do (KR); Kyo-yeol Lee, Kyungki-do (KR); Jae-hee Cho, Seoul (KR); Su-hee Chae, Kyungki-do (KR)

(73) Assignee: Samsung Electronics Co., Ltd., Suwon-Si, Seoul (KR)

( * ) Notice: Subject to any disclaimer, the term of this patent is extended or adjusted under 35 U.S.C. 154(b) by 214 days.

(21) Appl. No.: 12/495,000

(22) Filed: Jun. 30, 2009

(65) Prior Publication Data

US 2009/0325334 A1    Dec. 31, 2009

Related U.S. Application Data

(60) Continuation of application No. 10/673,251, filed on Sep. 30, 2003, now Pat. No. 7,566,578, which is a division of application No. 10/012,309, filed on Dec. 12, 2001, now Pat. No. 6,657,237.

(30) Foreign Application Priority Data

Dec. 18, 2000  (KR) .................................. 2000-77746
Jan. 29, 2001  (KR) .................................... 2001-4035

(51) Int. Cl.
*H01L 21/00*  (2006.01)
(52) U.S. Cl. ........... 438/46; 438/693; 438/704; 438/706
(58) Field of Classification Search .................. 257/745; 438/46.693, 704, 706
See application file for complete search history.

(56) References Cited

U.S. PATENT DOCUMENTS

| 5,554,877 | A |   | 9/1996  | Kitagawa et al. |
| 5,698,453 | A |   | 12/1997 | Green et al. |
| 5,834,325 | A |   | 11/1998 | Motoki et al. |
| 5,862,167 | A | * | 1/1999  | Sassa et al. ............... 372/45.01 |

(Continued)

FOREIGN PATENT DOCUMENTS

JP    3-169092 A    7/1991

(Continued)

OTHER PUBLICATIONS

Official Action issued by the Patent Office of the People's Republic of China in corresponding Chinese Patent Application No. 200410076862.9, May 11, 2007; and English translation thereof.

*Primary Examiner* — David Vu
*Assistant Examiner* — Caleb Henry
(74) *Attorney, Agent, or Firm* — Buchanan Ingersoll & Rooney PC

(57) ABSTRACT

A GaN based III-V nitride semiconductor light-emitting device and a method for fabricating the same are provided. In the GaN based III-V nitride semiconductor light-emitting device including first and second electrodes arranged facing opposite directions or the same direction with a high-resistant substrate therebetween and material layers for light emission or lasing, the second electrode directly contacts a region of the outmost material layer exposed through an etched region of the high-resistant substrate. A thermal conductive layer may be formed on the bottom of the high-resistant substrate to cover the exposed region of the outmost material layer.

5 Claims, 22 Drawing Sheets

U.S. PATENT DOCUMENTS

| | | | |
|---|---|---|---|
| 5,864,171 A * | 1/1999 | Yamamoto et al. | 257/628 |
| 5,905,275 A * | 5/1999 | Nunoue et al. | 257/95 |
| 5,963,790 A | 10/1999 | Matsuno et al. | |
| 6,069,394 A * | 5/2000 | Hashimoto et al. | 257/466 |
| 6,080,599 A * | 6/2000 | Yamamoto et al. | 438/33 |
| 6,121,634 A * | 9/2000 | Saito et al. | 257/86 |
| 6,163,557 A * | 12/2000 | Dunnrowicz et al. | 372/46.01 |
| 6,172,382 B1 | 1/2001 | Nagahama et al. | |
| 6,201,265 B1 * | 3/2001 | Teraguchi | 257/99 |
| 6,239,033 B1 * | 5/2001 | Kawai | 438/693 |
| 6,468,902 B2 | 10/2002 | Kawai | |
| 6,677,173 B2 | 1/2004 | Ota | |
| 2001/0035580 A1 * | 11/2001 | Kawai | 257/745 |
| 2002/0017653 A1 | 2/2002 | Chuang | |

FOREIGN PATENT DOCUMENTS

| | | |
|---|---|---|
| JP | 4-297082 | 10/1992 |
| JP | 7-202325 | 8/1995 |
| JP | 7-221347 | 8/1995 |
| JP | 10-270802 | 10/1998 |
| JP | 11-045892 A | 2/1999 |
| JP | 2000-261088 | 9/2000 |
| JP | 2000-312049 A | 11/2000 |
| JP | 2001-94148 | 4/2001 |

* cited by examiner

METHOD FOR MANUFACTURING OF LIGHT EMITTING DEVICE USING GAN SERIES III-V GROUP NITRIDE SEMICONDUCTOR MATERIAL

This application is a divisional of application Ser. No. 10/012,309, filed on Dec. 12, 2001, which claims priority to Patent Application No. 2000-77746, filed in the Republic of Korea on Dec. 18, 2000 and 2001-4035 filed in the Republic of Korea on Jan. 29, 2001, the entire contents of which are incorporated by reference.

BACKGROUND OF THE INVENTION

1. Field of the Invention

The present invention relates to a semiconductor light-emitting device and a method for fabricating the same, and more particularly, to a GaN based Group III-V nitride semiconductor light-emitting device and a method for fabricating the same.

2. Description of the Related Art

Compound semiconductor based light-emitting diodes or laser diodes capable of emitting short-wavelength visible light are widely known. In particular, a light-emitting device (light-emitting diode) or laser diode fabricated using a Group III nitride semiconductor has received considerable attention because the Group III nitride semiconductor is a direct transition type material (direct bandgap material) emitting blue light at high efficiencies by the recombination of electrons and holes.

Referring to FIG. 1, a conventional light-emitting diode (LED) based on GaN based III-V nitrides includes an n-type GaN layer 12 on a sapphire substrate 10. The n-type GaN layer 12 is divided into first and second regions R1 and R2. The first region R1 has a larger width then the second region R2 and is not affected by etching after having been formed. Meanwhile, the second region R2 is thinner than the first region R1 because it is affected by etching after having been formed. As a result, there exists a step between the first and second regions R1 and R2 of the n-type GaN layer 12. An active layer 16, a p-type GaN layer 18, and a light-transmitting p-type electrode 20 are sequentially formed on the first region R1 in the n-type GaN layer 12. A pad layer 22 for use in bonding in a packaging process is formed on the light-transmitting p-type electrode 20. An n-type electrode 14 is formed in the second region R2 of the n-type GaN layer 12.

In FIG. 2, a conventional GaN based III-V nitride semiconductor laser diode in which n-type and p-type electrodes are arranged to face the same direction, and a ridge is formed in a region where the p-type electrode is formed, is shown. In the semiconductor laser diode, In particular, referring to FIG. 2, an n-type GaN layer 12, which is divided into first and second regions R1 and R2, is formed on a sapphire substrate 10. The first region R1 is wider and thicker than second region R2 so that there exists a step between the first and second regions R1 and R2. An n-type electrode 14 is formed in the second region R2 of the n-type GaN layer 12. An n-type AlGaN/GaN layer 24, an n-type GaN layer 26, and an InGaN layer 28 acting as an active layer, for which the refractive index increasingly higher in the upward direction, are sequentially formed on the first region R1 of the n-type GaN layer 12. A p-type GaN layer 30, a p-type AlGaN/GaN layer 32, and a p-type GaN layer 36, for which the refractive index is increasingly lower in the upward direction, are sequentially formed on the InGaN layer 28. The p-type AlGaN/GaN layer 32 has a ridge (or rib) at the center thereof, and the p-type GaN layer 36 is formed on the ridge of the p-type AlGaN/GaN layer 32.

The entire surface of the p-type AlGaN/GaN layer 32 is covered with a passivation layer 34. Here, the passivation layer 34 extends to the p-type GaN layer 36 such that the current threshold is reduced. That is, the passivation layer 34 covers both edges of the p-type GaN layer 36. A p-type electrode 38 is formed on the passivation layer 34 in contact with a top surface of the p-type GaN layer 36, which is not covered by the passivation layer 34.

For a conventional light-emitting diode or laser diode based on a GaN based III-V nitride semiconductor in which the n-type and p-type electrodes are arranged to face the same direction, a bonding process with two wires should be performed on the same plan in a packaging process. Thus, the packaging process is complex and increases time consumption. The n-type electrode is formed in a deeply etched region so that a large step exists between the n-type and p-type electrodes, thereby increasing failure in packaging processes. As described with reference to FIGS. 1 and 2, in terms of the structure of the second region R2 of the n-type GaN layer 12, the n-type GaN layer 12 is etched to form the second region R2, for the light-emitting diode of FIG. 1, after the formation of the p-type electrode 20 or the p-type GaN layer 18, and for the laser diode of FIG. 2, after the formation of the p-type AlGaN/GaN layer 32. In other words, to form the n-type electrode 14 on the second region R2, an additional photolithography process is required, thereby increasing the manufacturing time of light-emitting devices.

FIG. 3 shows another conventional GaN based III-V nitride semiconductor laser diode in which an n-type electrode and a p-type electrode are arranged to face opposite directions with an active layer therebetween. An n-type GaN layer 12, an n-type AlGaN/GaN layer 24, an n-type GaN layer 26, an InGaN layer 28 acting as an active layer, a p-type GaN layer 30, a p-type AlGaN/GaN layer 32, and a p-type GaN layer 36, a passivation layer 34, and a p-type electrode 38 are sequentially formed on a silicon carbide (SiC) substrate 10a (or a gallium nitride (GaN) substrate). An n-type electrode 14a is formed on the bottom of the SiC substrate 10a.

In general, the current threshold and the lasing mode stability for laser emission in semiconductor laser diodes are closely associated with temperature, and all quantal properties degrade as the temperature rises. Therefore, there is a need to dissipate heat generated in an active layer during laser emission to prevent a temperature rise in the laser diode. For the conventional GaN based III-V semiconductor laser diode, the substrate has a very low thermal conductivity (about 0.5 W/CmK for sapphire) so that the heat is dissipated mostly through the ridge. However, heat dissipation through the ridge is limited so that a temperature rise in laser diodes cannot be prevented effectively, thereby lowering the properties of devices.

For the conventional semiconductor laser diode shown in FIG. 2, it has been intended to dissipate heat generated in the active layer by applying a flip chip bonding technique, as illustrated in FIG. 4.

In particular, referring to FIG. 4, reference character A denotes the inverted conventional GaN based III-V semiconductor laser diode shown in FIG. 2. Reference numeral 40 denotes a submount, reference numerals 42a and 42b denote pad layers, reference numerals 44a and 44b denote first and second thermal conductive layers connected to an n-type electrode 14 and a p-type electrode 38, respectively, of the semiconductor laser diode A. Reference character M denotes a stack of material layers corresponding to the material layers 24 through 34 of FIGS. 2 and 3 stacked between the n-type GaN layer 12 and the p-type electrode 38.

As described above, heat dissipation efficiency can be improved by bonding a semiconductor laser diode to a separate heat dissipating assembly. However, bonding between the laser diode and the heat dissipating assembly increases the overall processing time. In addition, such a bonding process needs to follow a fine alignment between the semiconductor laser diode and the heat dissipating assembly, so that failure is more likely to occur, thereby lowering yield.

For example, assuming that the yield is 70%, about 4,000 pieces of laser diodes per wafer are obtained. A bonding time required for flip-chip bonding of all the laser diodes amounts about 20 hours (about 0.3 minutes each).

SUMMARY OF THE INVENTION

To solve the above-described problems, it is a first object of the present invention to provide a GaN based III-V nitride semiconductor light-emitting device which a photolithography process applied to form electrodes and a package process are simplified with reduced manufacturing time and low failure.

It is a second object of the present invention to provide a method for fabricating a GaN based III-V nitride semiconductor light-emitting device.

To achieve the first object of the present invention, there is provided a light-emitting device comprising: an active layer in which light is emitted; first and second electrodes arranged facing each other around the active layer; a first compound semiconductor layer formed between the active layer and the first electrode; a second compound semiconductor layer, opposite to the first compound semiconductor layer, formed between the active layer and the second electrode; and a high-resistant substrate formed on the bottom of the first compound semiconductor layer while being partially removed to allow an electrical contact between the first compound semiconductor layer and the first electrode.

It is preferable that a via hole exposing the bottom of the first compound semiconductor layer is formed in the high-resistant substrate, and the first electrode contacts the first compound semiconductor layer through the via hole. The first electrode is comprised of an ohmic contact layer covering a region of the first compound semiconductor layer exposed through the via hole of the high-resistant substrate, and a thermal conductive layer formed on the ohmic contact layer.

It is preferable that the high-resistant substrate covers only a portion of the bottom of the first compound semiconductor layer, and the first electrode contacts a part of or the entire first compound semiconductor layer. Preferably, the high-resistant substrate is a sapphire substrate. Preferably, both the first and second electrodes are formed of a light-transmitting material. Preferably, the first (or second) electrode is formed of a light-reflecting material and the second (or first) electrode is formed of a light-transmitting material. It is preferable that the light-emitting device further comprises a pad layer partially or fully covering the second electrode. It is preferable that the light-emitting device further comprises a pad layer partially or fully covering the first electrode. It is preferable that the first compound semiconductor layer is an n-type or undoped GaN based III-V nitride compound semiconductor layer. It is preferable that the second compound semiconductor layer is a p-type GaN based III-V nitride compound semiconductor layer. The active layer is preferably an $In_xAl_yGa_{1-x-y}N$ layer having, more preferably, a multi-quantum well (MQW) structure, where $0 \leq x \leq 1$, $0 \leq y \leq 1$, and $x+y \leq 1$.

In another embodiment, the present invention provides a light-emitting device comprising: a high-resistant substrate; first and second electrodes arranged with the high-resistant substrate therebetween; and a material layer formed for lasing between the high-resistant substrate and the second electrode, wherein a region of the high-resistant substrate is removed, and the first electrode contacts the material layer through the removed region of the high-resistant substrate.

It is preferable that the material layer for lasing comprises: a resonator layer; first and second cladding layers arranged with the resonator layer therebetween; first and second compound semiconductor layers arranged on the respective first and second cladding layers; and a passivation layer formed between the second cladding layer and the second electrode in contact with a region of the second compound semiconductor layer in a symmetrical manner, wherein the bottom of the first compound semiconductor layer contacts the first electrode through the removed region of the high-resistant substrate. It is preferable that the resonator layer comprises: an active layer in which lasing occurs; a first waveguide layer formed between the active layer and the first cladding layer; and a second waveguide layer formed between the active layer and the second cladding layer. It is preferable that a via hole exposing the bottom of the first compound semiconductor layer is formed in the high-resistant substrate, and the first electrode contacts the first semiconductor compound layer through the via hole. It is preferable that the high-resistant substrate covers only a region of the bottom of the first compound semiconductor layer, and the first electrode contacts a part of or the entire of the first compound semiconductor layer. The active layer is preferably an $In_xAl_yGa_{1-x-y}N$ layer having, more preferably, a MQW structure, where $0 \leq x \leq 1$, $0 \leq y \leq 1$, and $x+y \leq 1$.

In another embodiment, the present invention provides a light-emitting device comprising: an active layer in which light is emitted; first and second material layers with the active layer therebetween, the first and second material layers are for inducing laser emission in the active laser by lasing; a first electrode formed in contact with the lowermost layer of the first material layers; a second electrode formed in contact with the uppermost layer of the second material layers in a restricted manner; and a heat-dissipating element displaced in contact with the lowermost layer of the first material layers for effective heat dissipation.

It is preferable that the heat-dissipating element is a thermal conductive layer, and the thermal conductive layer contacts a region of the lowermost layer of the first material layers while a substrate is present on the remaining region of the lowermost layer of the first material layers. It is preferable that the thermal conductive layer contacts the region of the lower most layer of the first material layers through a via hole formed in the substrate. In this case, a dent extending into the lowermost layer of the first material layers may be formed along with the via hole in the substrate. The via hole may be formed in a region of the substrate aligned with the first electrode. A plurality of via holes may be formed in the substrate. It is preferable that the via hole extends past the lowermost layer of the first material layers. It is preferable that a region of the lowermost layer of the first material layers is etched by a predetermined thickness so that there exists a step between the region of the lowermost layer of the first material layers on which the substrate is present and the etched region of the lowermost layer where the substrate is not present. Preferably, a portion of the thermal conductive layer indirectly contacts the lowermost layer of the first material layers by the dent. In this case, a plurality of dents may be formed in the substrate, and a via hole extending past the lowermost material layer may be additionally formed in the substrate.

It is preferable that the thermal conductive layer comprises at least one selected from the group consisting of gold (Au), silver (Ag), copper (Cu), nickel (Ni), and indium (In).

To achieve the second object of the present invention, there is provided a method for fabricating a light-emitting device, the method comprising: (a) sequentially forming a first compound semiconductor layer, an active layer, and a second compound semiconductor layer, which are for inducing light emission, on a high-resistant substrate; (b) forming a light-transmitting conductive layer on the second compound semiconductor layer; (c) etching a region of the high-resistant substrate to expose the first compound semiconductor layer; and (d) forming a high-shielding conductive layer to cover the exposed region of the first compound semiconductor layer. Preferably, step (c) comprises: polishing the bottom of the high-resistant substrate; and exposing the bottom of the first compound semiconductor layer by etching the region of the high-resistant substrate. Preferably, the high-resistant substrate is a sapphire substrate. Preferably, the bottom of the high-resistant substrate is polished by grinding or lapping. Preferably, the high-resistant substrate is dry etched. In this case, a predetermined region to be a via hole or the remaining region of the high-resistant substrate may be etched. Preferably, the light-emitting device fabrication method further comprises forming a pad layer on the light-transmitting conductive layer.

In one embodiment, the present invention provides a method for fabricating a light-emitting device, the method comprising: (a) sequentially forming a first compound semiconductor layer, an active layer, and a second compound semiconductor layer, which are for inducing light emission, on a high-resistant substrate; (b) forming a light-reflecting conductive layer on the second compound semiconductor layer; (c) etching a region of the high-resistant substrate to expose the first compound semiconductor layer; and (d) forming a light-transmitting conductive layer to cover the exposed region of the first compound semiconductor layer. It is preferable that step (c) comprises: polishing the bottom of the high-resistant substrate; and exposing the bottom of the first compound semiconductor layer by etching the region of the high-resistant substrate.

In another embodiment, the present invention provides a method for fabricating a light-emitting device, the method comprising: (a) forming a material layer for lasing on a high-resistant substrate; (b) forming a first electrode on the material layer; (c) etching a region of the high-resistant substrate to expose a region of the material layer; and (d) forming a second electrode on the bottom of the high-resistant substrate to cover partially or fully the exposed region of the material layer. It is preferable that step (a) comprises: sequentially forming a first compound semiconductor layer, a first cladding layer, a resonator layer, a second cladding layer, and a second compound semiconductor layer on the high-resistant substrate; forming a mask pattern on the second compound semiconductor layer to cover a predetermined region of the second compound semiconductor layer; sequentially patterning the second compound semiconductor layer and the second cladding layer using the mask pattern as an etch mask, the second cladding layer into a rigid form; removing the mask pattern; and forming a passivation layer on the second cladding layer patterned into the ridge form, in contact with a region of the patterned second compound semiconductor layer. It is preferable that step (c) comprises: polishing the bottom of the high-resistant substrate; and exposing the bottom of the first compound semiconductor layer by etching the region of the high-resistant substrate. It is preferable that the high-resistant substrate is a sapphire substrate. Preferably, the high-resistant substrate is dry etched. It is preferable that the high-resistant substrate is etched to form a via hole through which the bottom of the first compound semiconductor layer is exposed. It is preferable that step (d) comprises: forming an ohmic contact layer on the bottom of the high-resistant substrate to cover partially or fully the exposed region of the material layer; and forming a thermal conductive layer on the ohmic contact layer.

According to the light-emitting device and the method for fabricating the same according to the present invention, the simplified bonding process reduces bonding failure, and the simplified photo and etching process makes the overall manufacture of devices easier and reduces the manufacturing time consumption.

BRIEF DESCRIPTION OF THE DRAWINGS

The above objects and advantages of the present invention will become more apparent by describing preferred embodiments thereof in detail with reference to the attached drawings in which.

DETAILED DESCRIPTION OF THE INVENTION

Figure 1:
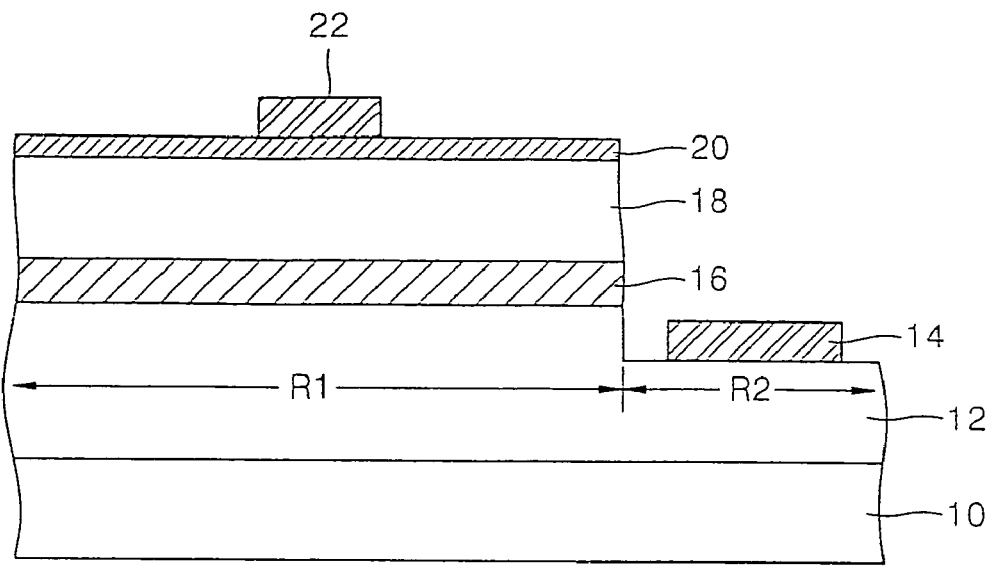
FIG. 1 is a sectional view of a conventional light-emitting diode (LED) based on GaN based III-V nitride semiconductor.
Figure 2:
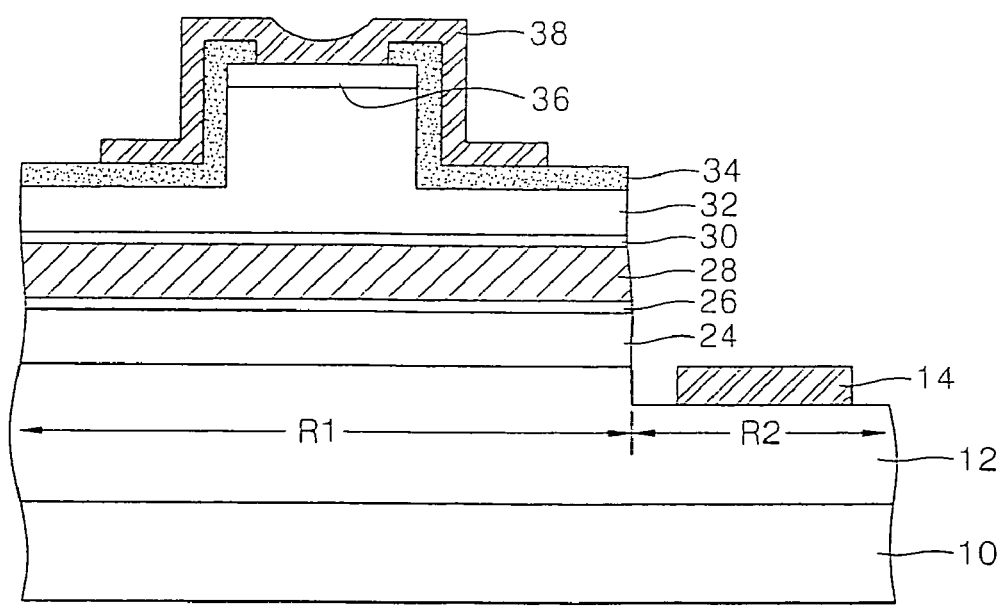
FIG. 2 is a sectional view of a conventional GaN based III-V nitride semiconductor laser diode having a waveguide ridge, in which n-type and p-type electrodes are arranged to face the same direction.
Figure 3:
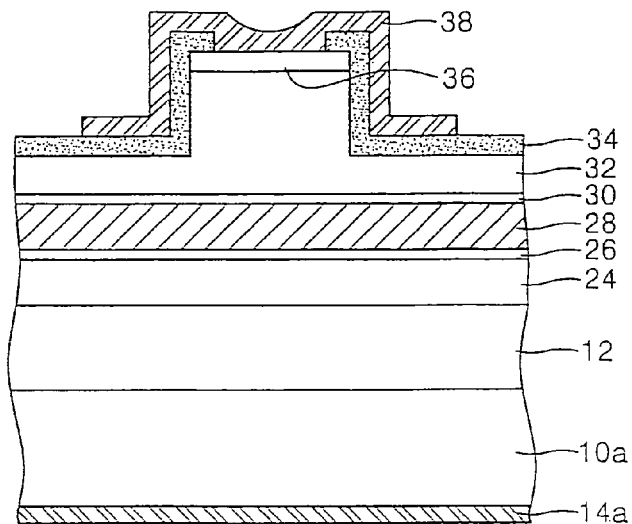
FIG. 3 is a sectional view of another conventional GaN based III-V nitride semiconductor laser diode having a waveguide ridge, in which n-type and p-type electrodes are vertically arranged to face opposite directions with an active layer therebetween.
Figure 4:
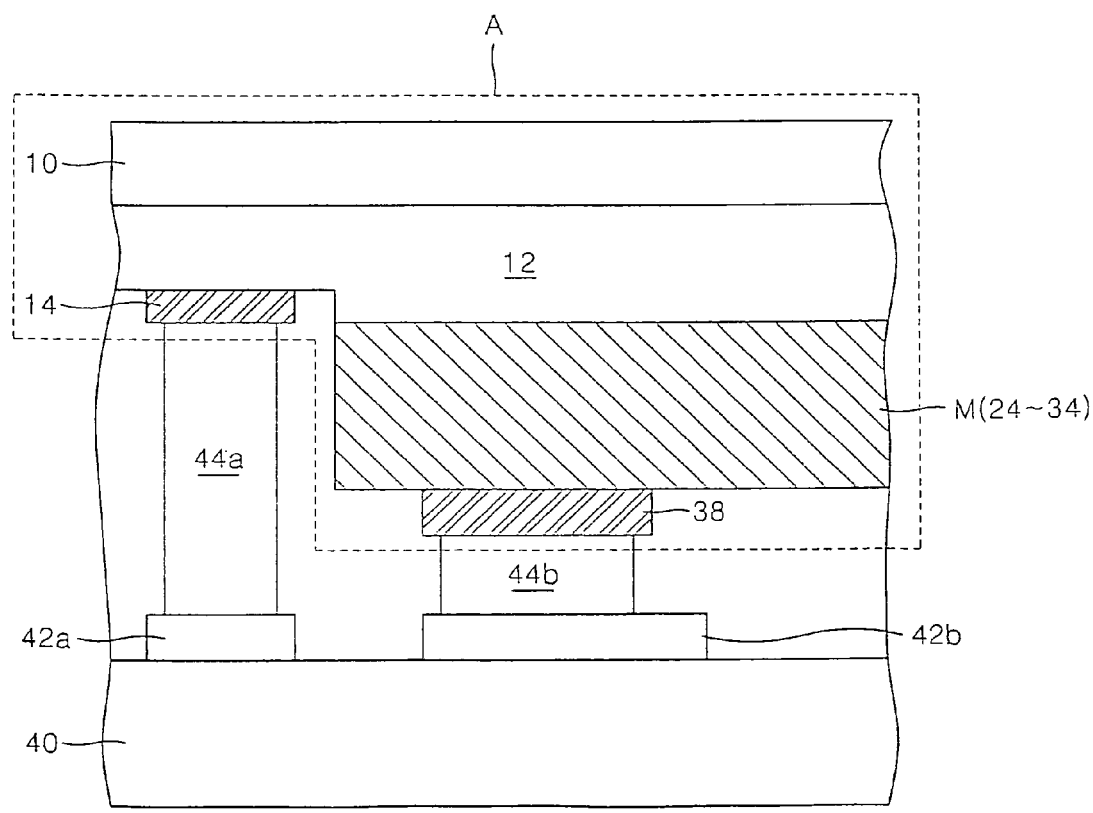
FIG. 4 is a sectional view illustrating the semiconductor laser diode of FIG. 2 bonded to a heat dissipating assembly.

A GaN based III-V nitride semiconductor light-emitting devices and a method for fabricating the same will be described more fully with reference to the accompanying drawings, in which preferred embodiments of the invention are shown. In the drawings, the thickness of layers and regions are exaggerated for clarity. Embodiments 1 through 4 are for light-emitting diodes (LEDs), and Embodiments 5 and 6 are for laser diodes (LDs).

Embodiment 1

Figure 5:
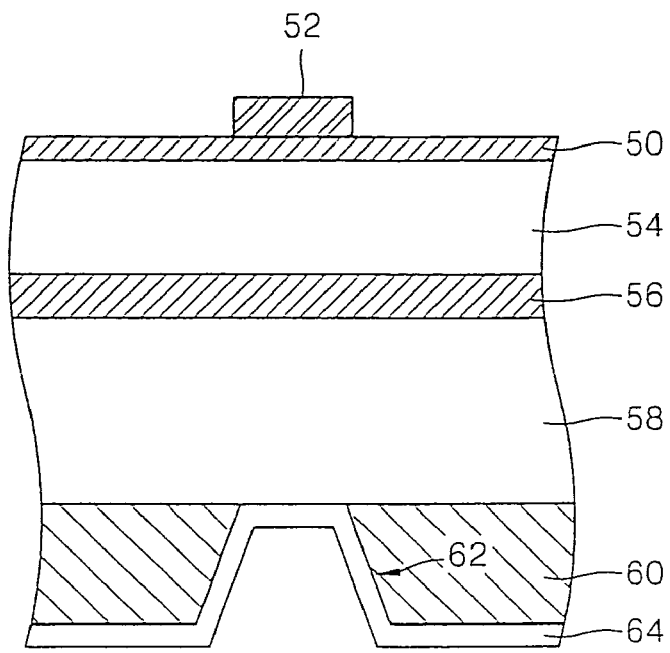
FIGS. 5 through 8 are sectional views of Embodiments 1 through 4 for GaN based III-V nitride semiconductor light-emitting diodes according to the present invention.

Referring to FIG. 5, reference numeral 50 denotes a light-transmitting conductive layer. The light-transmitting conductive layer 50 is used as a first electrode. A pad layer 52 for use in bonding of the light-transmitting conductive layer 50 is formed on the light-transmitting conductive layer 50. Although not illustrated in FIG. 5, an insulating layer such as a silicon oxide ($SiO_2$) or silicon nitride (SiN) layer may be partially interposed to improve adhesion between the light-transmitting conductive layer 50 and the pad layer 52. A second compound semiconductor layer 54 is formed underneath the light-transmitting conductive layer 50. The second compound semiconductor layer 54 is a GaN based III-V nitride compound semiconductor layer. Preferably, the second compound semiconductor layer 54 is formed of a direct transition type (direct band-gap) material doped with p-type conductive impurity, and more preferably, p-GaN layer.

The second compound semiconductor layer 54 may be an undoped material layer. For example, the second compound semiconductor layer 54 may be a GaN layer or an AlGaN or InGaN layer in which Al or In is contained in a predetermined ratio.

An active layer 56 is formed underneath the second compound semiconductor layer 54. The active layer 56 is a material layer in which lasing occurs by the recombination of carriers such as holes and electrons. Preferably, the active layer 56 is a GaN serious III-V nitride compound semiconductor layer having a multi-quantum well (MWQ) structure, and more preferably, an $In_xAl_yGa_{1-x-y}N$ layer (where $0 \leq x \leq 1$, $0 \leq y \leq 1$, and $x+y \leq 1$). A first compound semiconductor layer 58 is formed underneath the active layer 56 doped with an opposite type of impurities to the second compound semiconductor layer 54. The first compound semiconductor layer 58 is formed of a GaN based III-V nitride compound semiconductor layer, and preferably a direct transition type material. If the first compound semiconductor layer 58 is doped with conductive impurities, an n-type GaN layer is preferred. If the first compound semiconductor layer 58 is not doped with conductive impurities, the first compound semiconductor layer 58 is formed of the same material layer as the second compound semiconductor layer 54. A high-resistant substrate 60 is present underneath the first compound semiconductor layer 58. A via hole 62 through which the bottom of the first compound semiconductor layer 58 is exposed is formed in the high-resistant substrate 60. The high-resistant substrate 60 is an etch-resistant substrate, for example, a sapphire substrate. A conductive layer 64 is formed on the bottom of the high-resistant substrate 60 in contact with the first compound semiconductor layer 58 through the via hole 62. The conductive layer 64 is a light-reflecting material layer acting as a second electrode. Therefore, light generated in the active layer 56 is emitted upwards through the light-transmitting conductive layer 50. The conductive layer 64 may comprise an ohmic contact layer covering a region of the first compound semiconductor layer exposed through the via hole 62 of the high-resistant substrate, and a thermal conductive layer formed on the ohmic contact layer.

Embodiment 2

The same elements as in Embodiment 1 will be denoted by the same reference numerals as in Embodiment 1, and descriptions thereof will be omitted.

Figure 6:
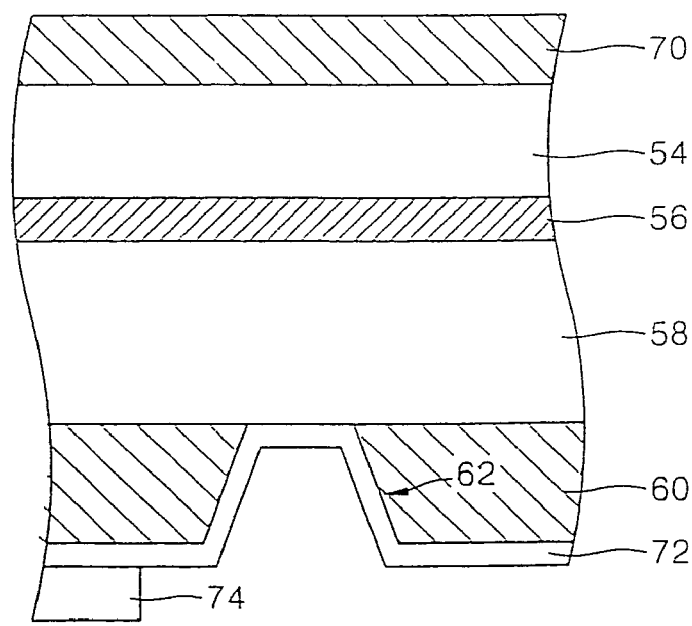

In particular, referring to FIG. 6, a light-reflecting conductive layer 70 acting as a first electrode is formed on the second compound semiconductor layer 54. A light-transmitting conductive layer 72 acting as a second electrode is formed on the bottom of the high-resistant substrate 60 in contact with the first compound semiconductor layer 58 through the via hole 62. A pad layer 74 is formed in a flat region of the conductive layer 72 covering the bottom, of the high-resistant substrate 60. The pad layer 74 is used for bonding the light-transmitting conductive layer 72 in a package process.

Embodiment 3

Figure 7:
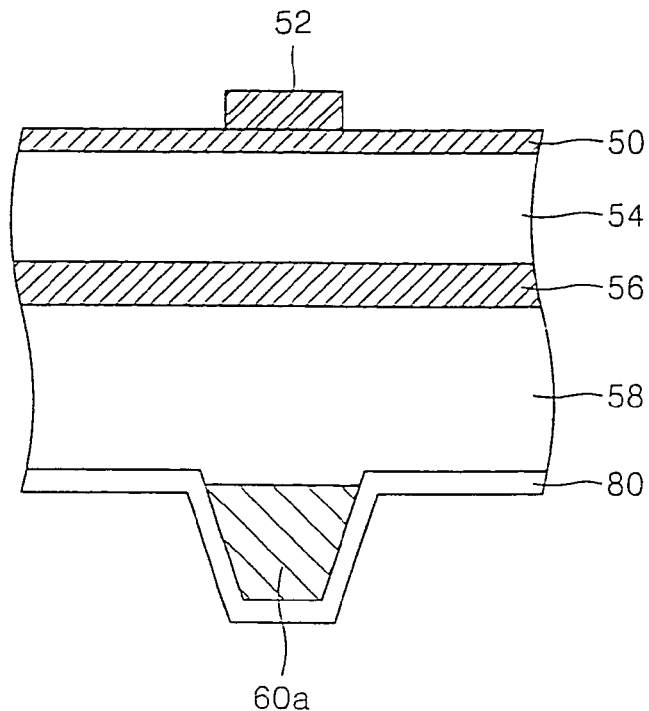

Referring to FIG. 7, a high-resistant substrate pattern 60a is present on the bottom of the first compound semiconductor layer 58. The high-resistant substrate pattern 60a is present at the center of the first compound semiconductor layer 58, exposing the other portion of the bottom of the first compound semiconductor layer 58. The bottom of the high-resistant substrate pattern 60a is narrower than a top of the high-resistant substrate pattern 60a in contact with the first compound semiconductor layer 58. The sidewall of the high-resistant substrate pattern 60a has a gentle slope to ensure a material layer to be deposited thereon with excellent step coverage. A conductive layer 80 is formed to cover the high-resistant substrate pattern 60a and the exposed portion of the first compound semiconductor layer 58. The conductive layer 80 is used as a second electrode and shields light.

Embodiment 4

Figure 8:
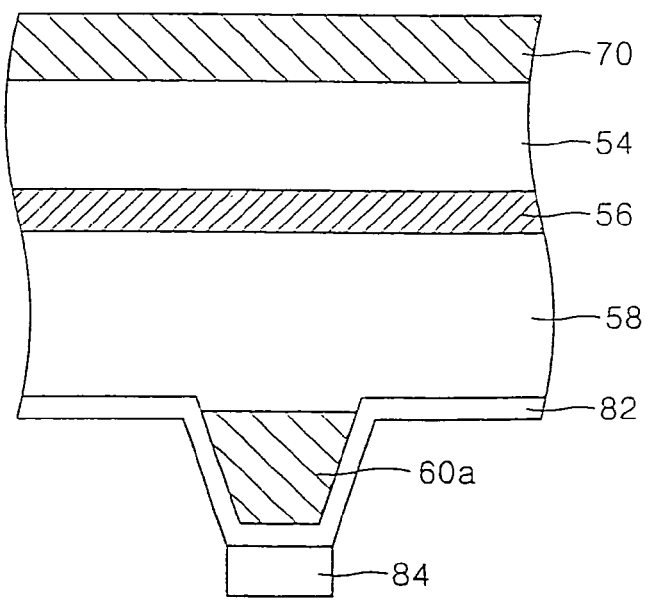

Referring to FIG. 8, a conductive layer 70 acting as a first electrode is formed on the second compound semiconductor layer 54. The same high-resistant substrate pattern 60a as in Embodiment 3 is formed on the bottom of the first compound semiconductor layer 58. A light-transmitting conductive layer 82 is formed to cover the high-resistant substrate pattern 60a and an exposed portion of the first compound semiconductor layer 58. A pad layer 84 is formed on the bottom of the high-resistant substrate pattern 60a. The pad layer 84 is used for bonding of the light-transmitting conductive layer 82 in a package process.

Embodiment 5

The present embodiment relates to a semiconductor laser diode characterized in that n-type and p-type electrodes are arranged to face the same direction and a thermal conductive layer is deposited to face in the opposite direction.

Figure 9:
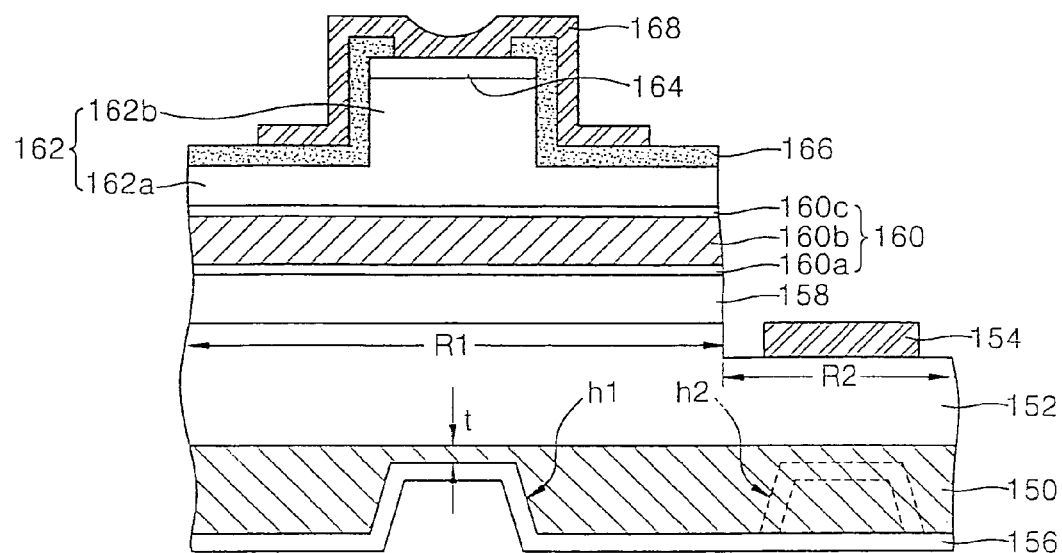
FIGS. 9 through 22 are sectional views of Embodiments 5 through 18 for GaN based III-V nitride semiconductor light-emitting diodes according to the present invention.

Referring to FIG. 9, a first compound semiconductor layer 152 is formed on a substrate 150. The substrate 150 is a high-resistant substrate such as a sapphire substrate or a III-V compound semiconductor such as a GaN or silicon carbide (SiC) substrate. Preferably, the first compound semiconductor layer 152 is an n-type or undoped GaN based III-V nitride compound semiconductor layer, and more preferably, an n-type GaN layer or a GaN layer. Alternatively, the first compound semiconductor layer 152 may be an AlGaN or InGaN layer containing Al or In in a predetermined ratio. The first compound semiconductor layer 152 is divided into first and second regions R1 and R2. The first region R1 is wider and thicker than the second region R2. There exists a step between the first and second regions R1 and R2. A first electrode 154, n-type electrode, is formed in the second region R2. A first dent h1 is formed indent from the bottom of the substrate 150 not to expose the first compound semiconductor layer 152, with a gap t from the interface between the substrate 150 and the first compound semiconductor layer 152. The gap t between the bottom of the first dent h1 and the first compound semiconductor layer 152 may be varied depending to the material used for the substrate 150. For example, the thermal conductivity of a sapphire substrate, a kind of high-resistant substrate, is very less than that of a GaN or SiC substrate. Thus, denoting the gap t for sapphire substrates as t1 and the gap t for GaN or SiC substrates as t2, a relationship of t2>t1 is established. However, irrespective of the type of substrates, it is preferable that the gap between the bottom of the first dent h1 and the first compound semiconductor layer 152 is determined such that heat is sufficiently dissipated through the first compound semiconductor layer 152 to lower a thermal resistance value.

As indicated by dashed lines in FIG. 9, a second dent h2 may be additionally formed in the substrate 150 to make heat-dissipating efficiency double. More dents may be formed in the substrate 150 if necessary.

A first thermal conductive layer 156 having excellent thermal conductivity is formed to cover the bottom of the first dent h1 on the substrate 150. The first thermal conductive layer 156 acts as a heat-dissipating material layer through which heat from the first compound semiconductor layer 152 is dissipated. The first thermal conductive layer 156 extends over the bottom of the substrate 150 covering the sidewall as well as the bottom of the first dent h1. The first thermal conductive layer 156 is formed of a material selected from the group consisting of gold (Au), silver (Ag), platinum (Pt), copper (Cu), nickel (Ni), indium (In), or an alloy of these materials. Any material having excellent thermal conductivity or an alloy thereof, other than the materials listed above, can be used for the first thermal conductive layer 156.

As described above, because the first thermal conductive layer 156 is formed in contact with a portion of the substrate 150 whose thickness is reduced to lower its thermal resistance such that heat transferred from the first compound semiconductor layer 152 is sufficiently dissipated through the portion, heat generated in the active layer during laser emission can be removed effectively. As a result, rising of the current threshold due to the temperature rise by laser emission and unstabilization of transverse laser mode are prevented, thereby improving the properties of the laser diode.

A first cladding layer 158 and a resonator layer 160 are sequentially formed on the first region R1 of the first compound semiconductor layer 152. The first cladding layer 158 is an n-type Al/GaN/GaN layer. The resonator layer 160 includes a waveguide layer 160a, an active layer 160b, and a second waveguide layer 160c, which are sequentially deposited on the first cladding layer 158. The first compound semiconductor layer 152, the first cladding layer 158, and the first waveguide layer 160a form a first material layer used to induce laser emission in the active layer 160b. The first compound semiconductor layer 152 is the lowermost layer of the first material layer. The active layer 160b is a material layer in which lasing occurs by the recombination of carriers such as holes and electrons, more preferably, a GaN based III-nitride compound semiconductor layer having a MQW structure, and most preferably, an $In_xAl_yGa_{1-x-y}N$ layer (where $0 \leq x \leq 1$, $0 \leq y \leq 1$, and $x+y \leq 1$). Alternatively, the active layer 160b may be formed of an InGaN layer in which In is contained in a predetermined ratio. The first and second waveguide layers 160a and 160c have a refractive index smaller than the active layer 160b but greater than the first cladding layer 158 and a second cladding layer described below. The first and second waveguide layers 160a and 160c are formed of GaN based III-V nitride compound semiconductor layers, and preferably, an n-type GaN layer and a p-type GaN layer, respectively. A second cladding layer 162 and a second compound semiconductor layer 164 are sequentially formed on the resonator layer 160. The second waveguide layer 160c, the second cladding layer 162, and the second compound semiconductor layer 164 form a second material layer used for inducing laser emission in the active layer 160b. The second compound semiconductor layer 164 is the uppermost layer of the second material layer.

The descriptions of the first and second material layers are applied to the following embodiments.

The second cladding layer 162 includes a ridge portion 162b formed at the center of the resonator layer 160 and a peripheral portion 162 formed to be symmetrical around the ridge portion 162b with a thickness smaller than the ridge portion 162b. The second compound semiconductor layer 164, the uppermost layer of the second material layer, is formed on the top of the ridge portion 162b of the second cladding layer 162. The second cladding layer 162 is formed of the same material layer of the first cladding layer 158 but doped with p-type impurity. The second compound semiconductor layer 164 is formed of a direct transition type material such as a p-type GaN based III-V nitride compound semiconductor layer, and preferably a p-type GaN layer. Like the first compound semiconductor layer 152, the second compound semiconductor layer 164 may be formed of a GaN layer, or an AlGaN or InGaN layer in which Al or In is contained in a predetermined ratio. The entire surface of the second cladding layer 162 is covered with a passivation layer 166. Here, the passivation layer 166 extends to an edge portion of the second compound material layer 164. A second electrode 168 is formed on the passivation layer 166 in contact with a portion of the second compound semiconductor layer 164, which is exposed through the passivation layer 166. The second electrode 168 is a p-type electrode.

The semiconductor laser diodes described in the above embodiments of the present invention ensure sufficient heat-dissipating efficiency without need for fine alignment to be connected with a separate heat dissipating assembly as in conventional laser diodes. Thus, the semiconductor laser diodes according to the present invention can be manufactured at lower cost with increased yield, compared to the conventional structure.

Embodiment 6

Figure 10:
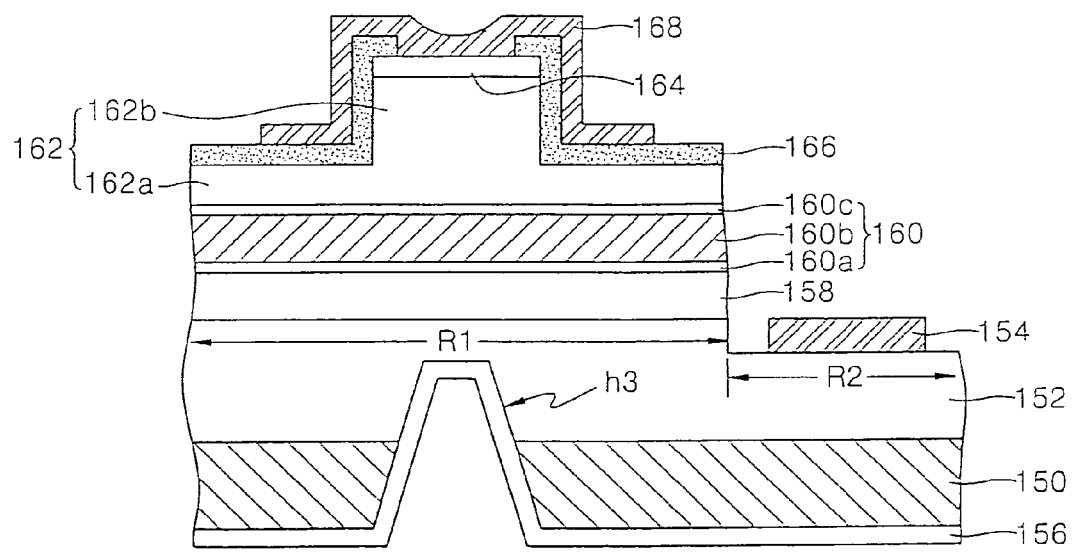

Referring to FIG. 10, a first via hole h3 may be formed by extending the first dent h1 to the first compound semiconductor layer 152 through the substrate 150. Although not illustrated in FIG. 10, a plurality of first via holes h3 may be formed, alternatively along with the second dent h2 shown in FIG. 9. The first via hole h3 extends past the surface of the first compound semiconductor layer 152 not to expose the bottom surface of the first compound semiconductor layer 152. The first thermal conductive layer 156 is formed not only in contact with the first compound semiconductor layer 152 exposed through the first via hole h3 but also covering the sidewall and bottom of the substrate 150 exposed through the first via hole h3.

Because the first thermal conductive layer 156 is formed in contact with the first compound semiconductor layer 152 through the first via hole h3, heat generated in the active layer 160b during laser emission can be removed much effectively.

Embodiment 7

Figure 11:
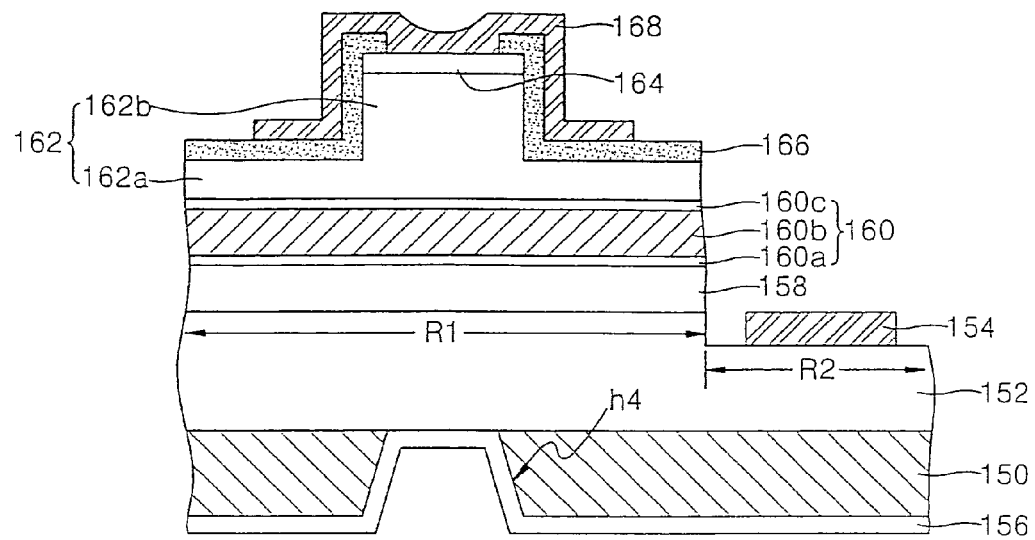
Figure 12:
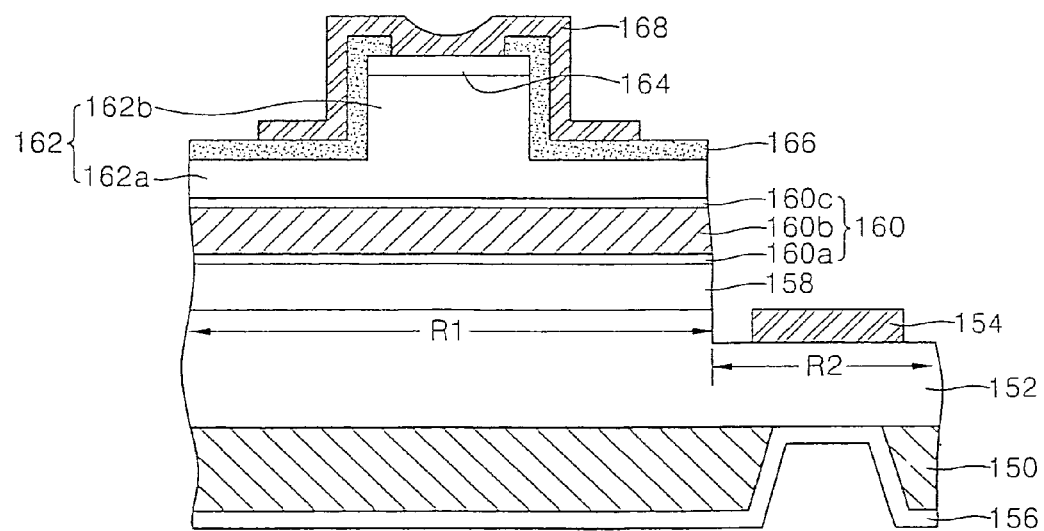

The semiconductor laser diode shown in FIG. 11 is the same as in FIG. 9 except that a second via hole h4 is formed in the substrate 150 to expose the bottom of the first compound semiconductor layer 152. The second via hole h4 may be aligned with the n-type electrode 154, as shown in FIG. 12, or a plurality of second via holes h4 may be formed in the substrate 150. Alternatively, the second via hole h4 may be formed in the substrate 150 along with the first dent h1 or the first via hole h3 extending to the first compound semiconductor layer 152, or both of them. The first thermal conductive layer 156 is formed to cover the second via hole h4 or any type of via holes described above and the bottom of the substrate 150.

Embodiment 8

The semiconductor laser diode shown in FIG. 12 is the same as in Embodiment 7 shown in FIG. 11, except that the second via hole h4 is formed in the substrate 150 to expose a portion of the second compound semiconductor layer 152 aligned with the n-type electrode 154.

Embodiment 9

Figure 13:
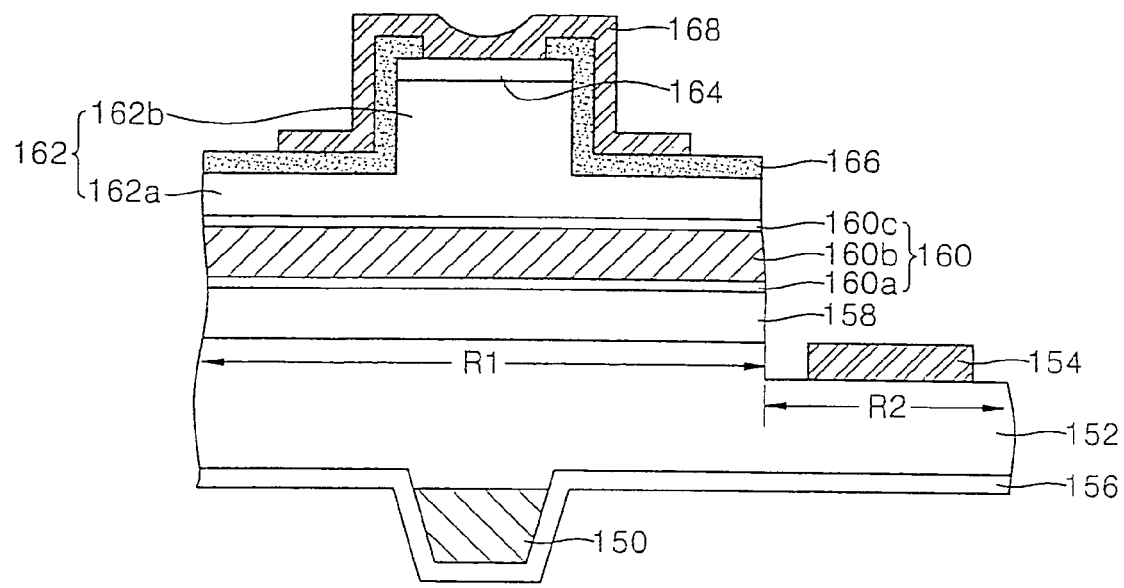

The semiconductor laser diode shown in FIG. 13 is the same as in Embodiment 5 shown in FIG. 9, except that the substrate 150 remains only on a portion of the bottom of the first compound semiconductor layer 152 aligned with the ridge portion 162 of the second cladding layer 162, and the bottom of the first compound semiconductor layer 152 surrounding the substrate 150 is etched by a predetermined thickness with a step between the etched portion of the first compound semiconductor layer 152 and the non-etched portion protected by the substrate 150. The first thermal conductive layer 156 is formed to cover the substrate 150 and the first compound semiconductor layer 152.

Embodiment 10

Figure 14:
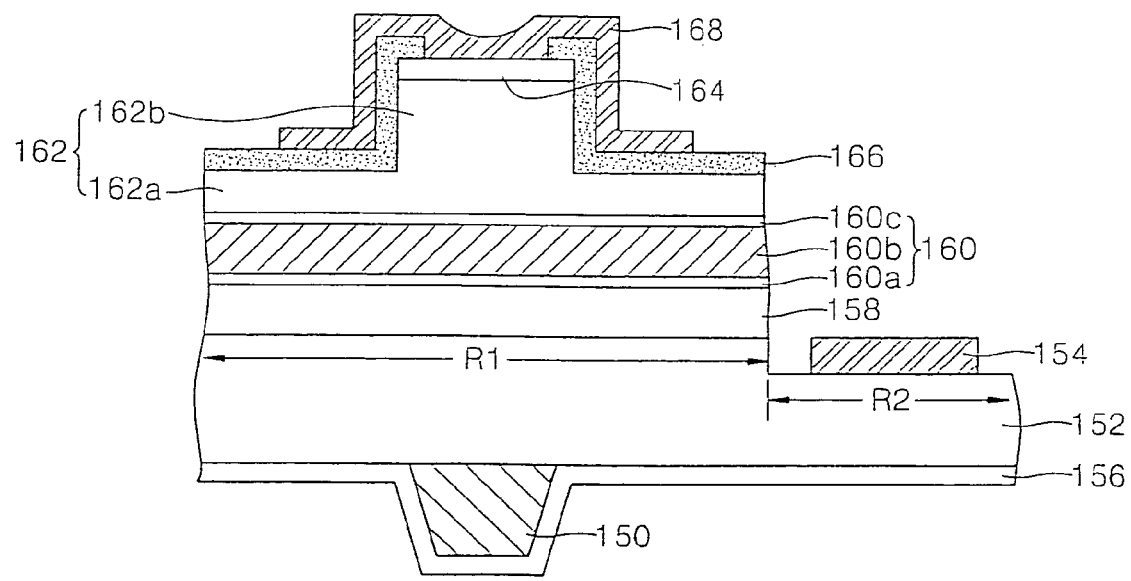

The semiconductor laser diode shown in FIG. 14 is the same as in Embodiment 9 shown in FIG. 13, except that no step exits on the bottom of the first compound semiconductor layer 152 because the bottom of the first compound semiconductor layer 152 is not etched.

Embodiment 11

Figure 15:
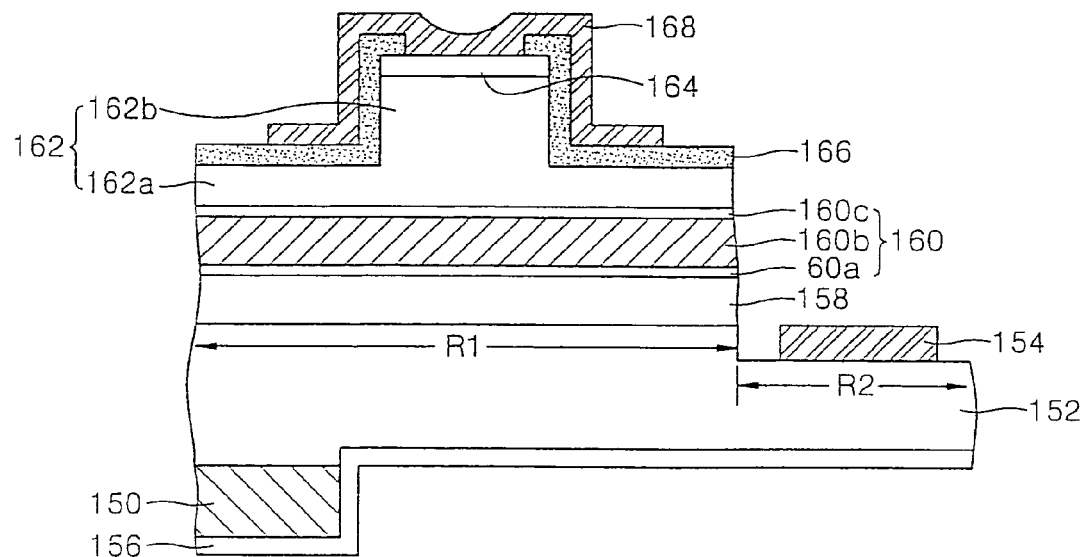

Unlike the semiconductor laser diode shown in FIG. 13 in which the substrate 150 remains on the bottom center of the first compound semiconductor layer 152, the substrate 150 is biased to a side of the first compound semiconductor layer 152 in the semiconductor laser diode shown in FIG. 15. Also, the first compound semiconductor layer 152 shown in FIG. 15 has a step between a portion protected by the substrate 150 and a portion exposed. The first thermal conductive layer is formed to cover the bottom of the first compound semiconductor layer 152 and the substrate 150.

Embodiment 12

Figure 16:
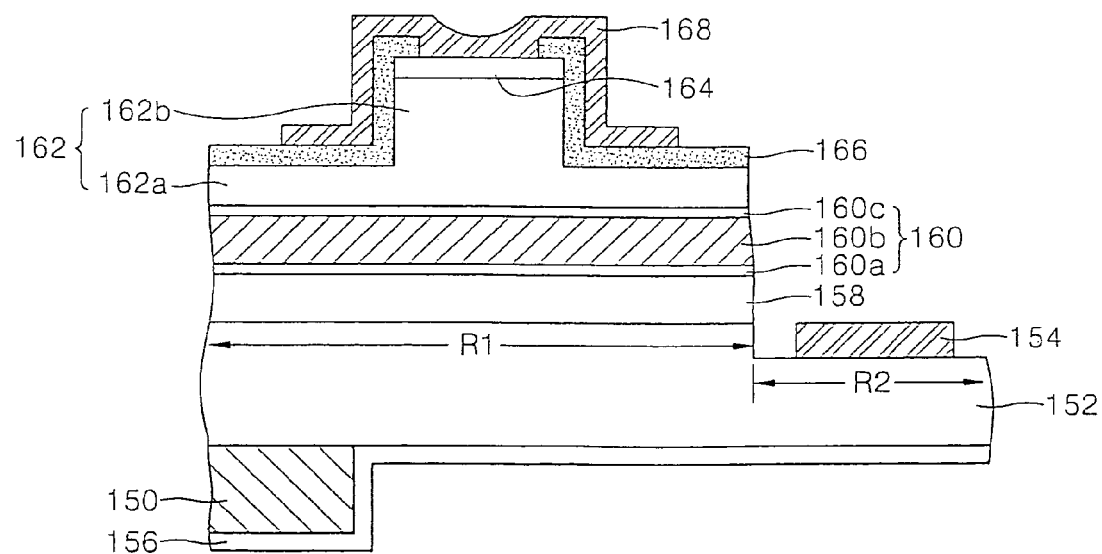

The semiconductor laser diode shown in FIG. 16 is the same as in Embodiment 11 shown in FIG. 15, except that no step exits on the bottom of the first compound semiconductor layer 152.

Semiconductor laser diodes in which n-type and p-type electrodes are vertically arranged with an active layer therebetween according to the present invention will be described in Embodiments 13 through 18 as follows.

Embodiment 13

Figure 17:
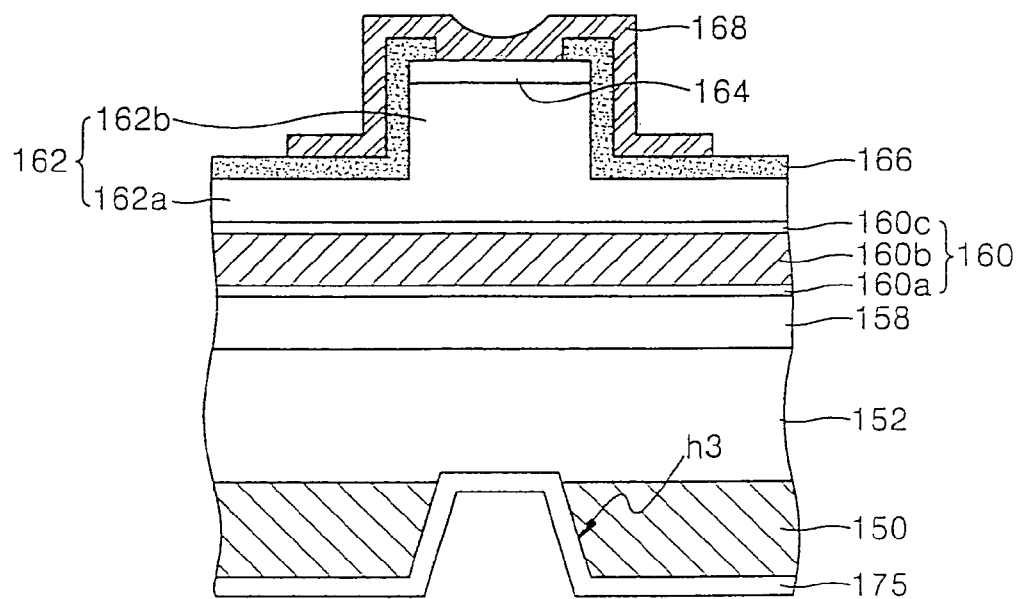

In FIG. 17, reference numeral 150 denotes a high-resistant substrate. The high-resistant substrate 150 is an etch-resistant sapphire substrate. Material layers for lasing are formed on the high-resistant substrate 150, and electrode material layers are formed in contact with material layers for lasing.

In particular, a first compound semiconductor layer 152 is formed on the high-resistant substrate 150. The first compound semiconductor layer 152 is formed of a GaN based III-V nitride compound semiconductor layer, which is a direct transition type, and preferably, an n-type GaN layer. A portion in the bottom of the first compound semiconductor layer 152 is exposed through a first via hole h3 formed in the high-resistant substrate 150, and a conductive layer 175 is formed on the bottom of the high-resistant substrate 150 in contact with the exposed portion of the first compound semiconductor layer 152. The conductive layer 175 is used as a lower electrode. A first cladding layer 158, an n-type AlGaN/GaN layer, is formed on the first compound semiconductor layer 152. A first waveguide layer 160a, an active layer 160b, and a second waveguide layer 160c, which form a resonator layer 160, are sequentially formed on the first cladding layer 158. The first and second waveguide layers 160a and 160c are formed of GaN based III-V nitride compound semiconductor layers, and preferably an n-type GaN layer and a p-type GaN layer, respectively. The first and second waveguide layers 160a and 160c have a refractive index greater than the first cladding layer 152. The active layer 160b is formed of a GaN based III-V nitride compound semiconductor layer containing In in a predetermined ratio, for example, an InGaN layer. The active layer 160b has a refractive index greater than the first and second waveguide layers 160a and 160c. Because the resonator layer 160 has a refractive index profile that has a peak refractive index in the center region and decreases outwards therefrom, as a described above, the laser emission efficiency in the active layer 160b is improved with reduced optical loss. The second cladding layer 162 is formed on the second waveguide layer 160c. The second cladding layer 162 is formed of the same material layer as the first cladding layer 158 but doped with p-type impurity. The second cladding layer 162 has a ridge portion 162a at its center and a peripheral portion 162a surrounding the ridge portion 162a to be parallel to the active layer 160b with a thickness smaller than the ridge portion 162a. A second compound semiconductor layer 164 is formed on the top of the ridge portion 162b of the second cladding layer 162. The second compound semiconductor layer 164 is formed of the same material layer as the first compound semiconductor layer 152 but doped with p-type impurity. The entire surface of the second cladding layer 162 is covered with a passivation layer 166. The passivation layer 166 contacts symmetrically both sides of the second compound semiconductor layer 164. A conductive layer 168 is formed on the passivation layer 166 in contact with a portion of the second compound semiconductor layer 164 exposed through the passivation layer 166. The conductive layer 168 is used as an upper electrode.

Embodiment 14

Figure 18:
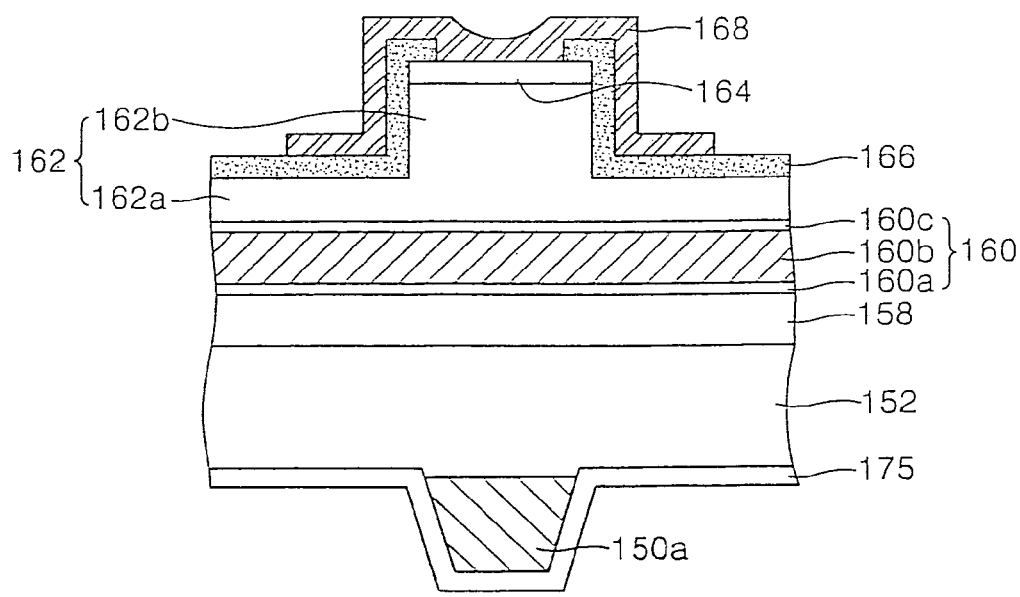

The semiconductor laser diode shown in FIG. 18 is the same as in Embodiment 13 shown in FIG. 17, except that a high-resistant substrate pattern 150a remains on the bottom center of the first compound semiconductor layer 152, and a conductive layer 175 is formed to cover the bottom of the first compound semiconductor layer 152 and the high-resistant substrate pattern 150a.

Embodiment 15

Figure 19:
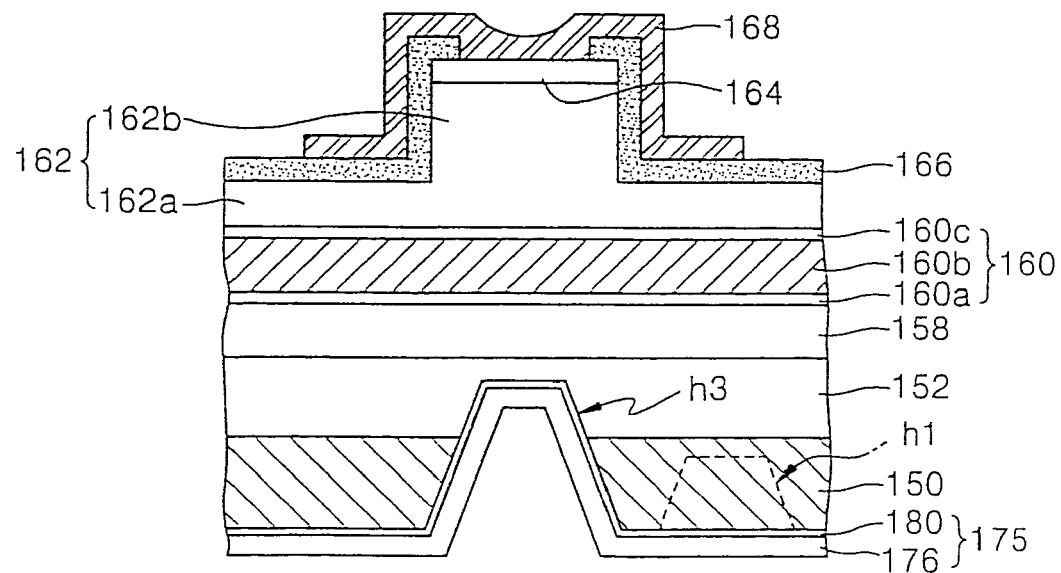

Referring to FIG. 19, the first compound semiconductor layer 152, the first cladding layer 158, the resonator layer 160, the second cladding layer 162, and the second compound semiconductor layer 164, the passivation layer 166, and a second electrode 168 are sequentially formed on the substrate 150. A first via hole h3 is formed through the substrate 150 to expose the first compound semiconductor layer 152. Preferably, the first via hole h3 is formed aligned with the second electrode 168. Alternatively, the first via hole h3 may be biased to any side with respect to the second electrode 168.

As indicated by dashed lines, the first via hole h3 may be formed in the substrate 50 along with a first dent h1. Due to the presence of the first dent h1, heat-dissipating efficiency is further improved.

A conductive layer 175 is formed to cover fully the portion exposed through the first via hole h3 and the bottom of the substrate 150. The conductive layer 175 includes an ohmic contact layer 180 in contact with the portion exposed through the first via hole h3 and the bottom of the substrate 150, and a second thermal conductive layer 176 formed on the ohmic contact layer 180. The second thermal conductive layer 176 not only acts to dissipate heat generated in the active layer 160b but also is used as a first (n-type) electrode. The ohmic contact layer 180 acts to match potential barriers between the second thermal conductive layer 176 and the second compound semiconductor layer 152.

In the present embodiment, the n-type electrode also acts as a thermal conductive layer.

Embodiment 16

Figure 20:
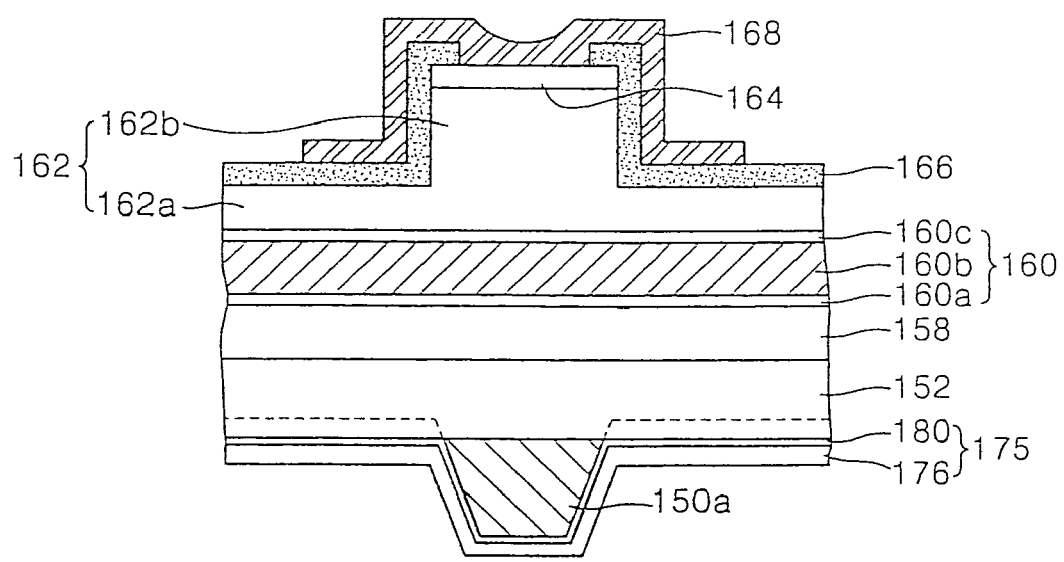

In the semiconductor laser diode shown in FIG. 20, a high-resistant substrate pattern 150a remains on a bottom portion of the first compound semiconductor layer 152 aligned with the ridge portion 162b of the second cladding layer 162. An ohmic contact layer 180 is formed to cover the bottom of the first semiconductor layer 152 and the high-resistant substrate pattern 150a, and a second thermal conductive layer 176 is formed on the ohmic contact layer 180. As indicated by dashed lines, a portion of the first compound semiconductor layer 152 exposed by the high-resistant substrate pattern 150a may be etched by a predetermined thickness. In this case, there exists a step between the etched portion of the first compound semiconductor layer 152 and the portion protected by the high-resistance semiconductor pattern 150a.

Embodiment 17

Figure 21:
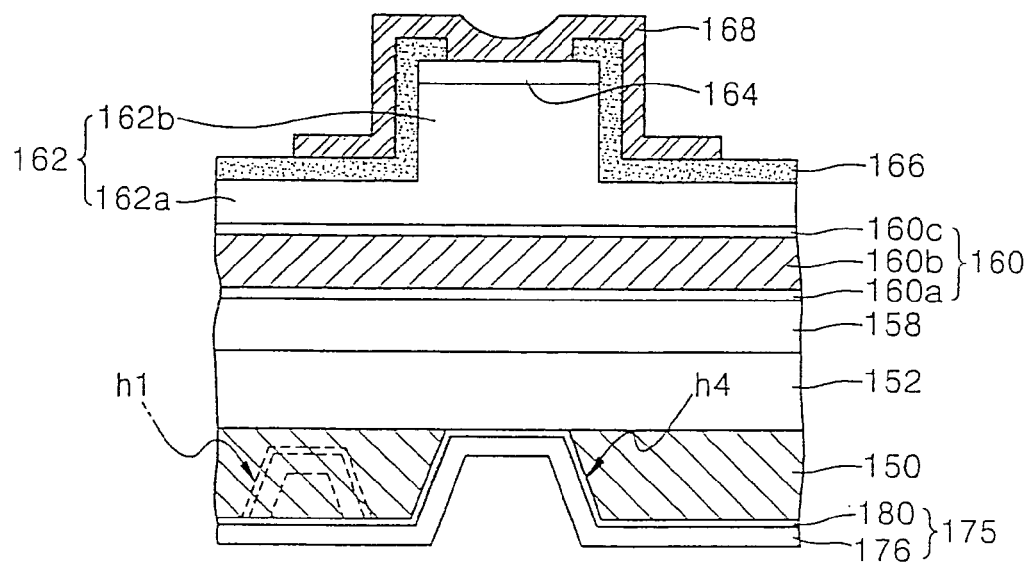

The semiconductor laser diode shown in FIG. 21 is the same as in Embodiment 15 shown in FIG. 19, except that a second via hole h4 is formed in the substrate 150 to expose a portion of the bottom of the first compound semiconductor layer 152. An ohmic contact layer 180 is formed to cover the substrate 150 and the exposed portion of the first compound semiconductor layer 152, and a second thermal conductive layer to be used as an n-type electrode is formed on the ohmic contact layer 180. It is preferable that the second via hole h4 is formed aligned with the second electrode 168. The second via hole h4 may be biased to a side from the position aligned with the second electrode 168.

A plurality of second via holes h4 may be formed in the substrate 150. In this case, only one of the second via holes h4 is coated with an ohmic contact layer to be used as a current flow path, and the remaining second via holes h4 are used only for improving heat-dissipating efficiency.

Alternatively, a first dent h1 can be additionally formed in the substrate 150 together with the second via hole h4.

Embodiment 18

Figure 22:
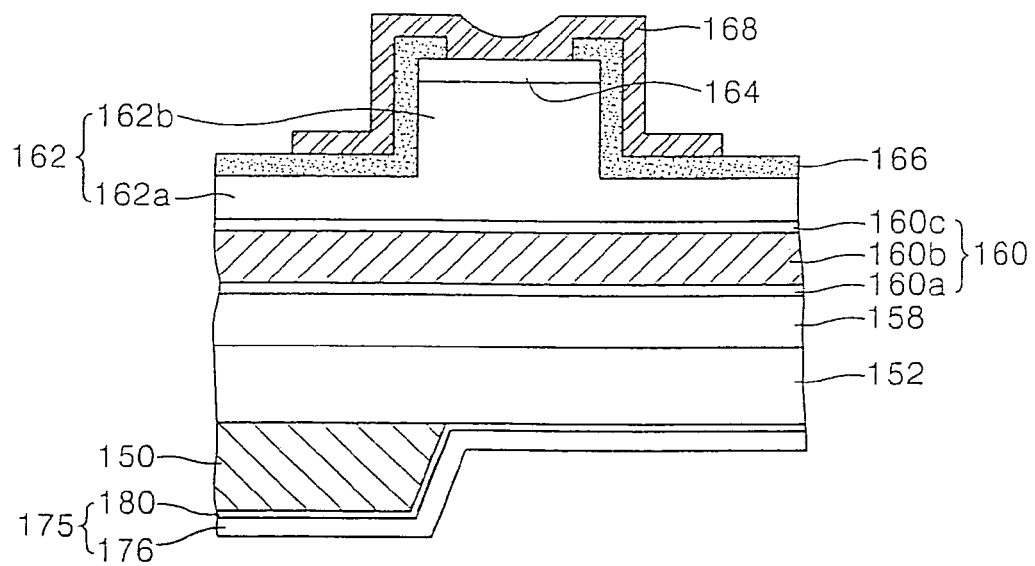

In the semiconductor laser diode shown in FIG. 22, a substrate 150 is biased to a side at the bottom of the first compound semiconductor layer 152 from the bottom center. An ohmic contact layer 180 is formed to cover the bottom of the first compound semiconductor layer 152 and the substrate pattern 150, and a first thermal conductive layer 176 to be used as an n-type electrode is formed on the ohmic contact layer 180. Although not illustrated in FIG. 12, a portion of the bottom of the first compound semiconductor layer 152 on which the substrate pattern 150 is not present may be etched by a predetermined thickness so that a step exists on the bottom of the first compound semiconductor layer 152.

Based on a variety of heat-dissipating elements described in the embodiments above in which the first or second thermal conductive layer 156 or 176 directly or indirectly in contact with the lowermost material layer of the first compound semiconductor layer 152 is formed, alternative laser diodes can be constructed. For example, the first thermal conductive layer 156 may be formed in contact with the bottom of the first compound semiconductor layer 152, which is the lowermost first material layer, by removing the substrate 150, or the second thermal conductive layer 176 may be formed on the ohmic contact layer 180 in contact with the bottom of the first compound semiconductor layer 152 by removing the substrate 150.

In particular, after the p-type electrode 168 is formed, the substrate is fully removed in a subsequent etching process such that the substrate 150 does not remain. Next, the first thermal conductive layer 156 is formed in contact with the bottom of the first compound semiconductor layer 152. Alternatively, the ohmic contact layer 180 is formed in contact with the bottom surface of the first compound semiconductor layer 152 and then the second thermal conductive layer 176 to be used as an n-type electrode is formed on the ohmic contact layer 180.

A method for fabricating a light-emitting device according to the present invention will be described with reference to the following embodiments.

Embodiment 1

Figure 23:
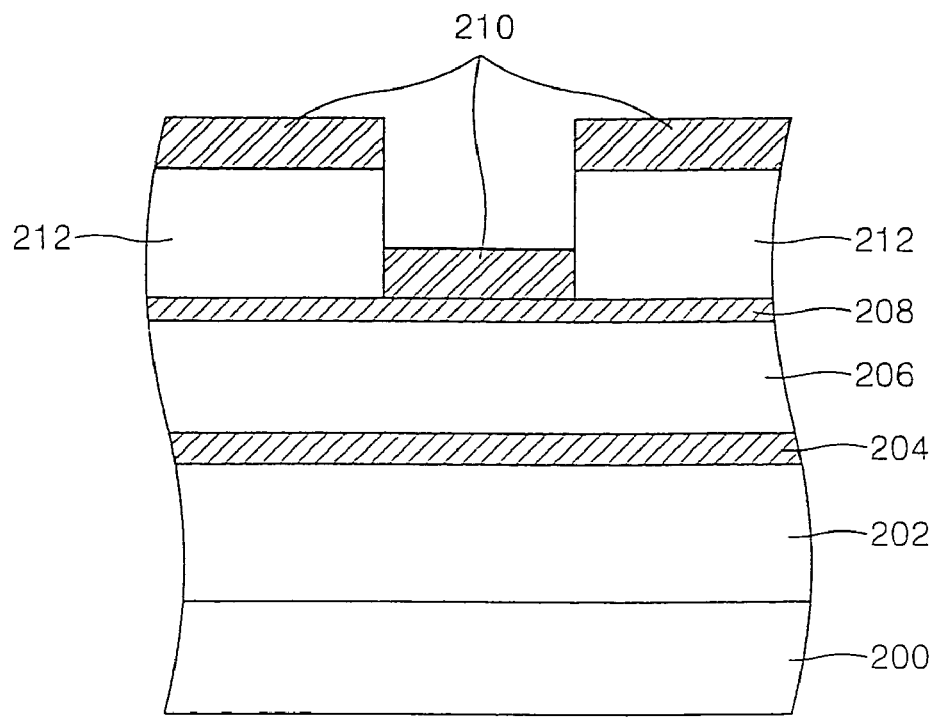
FIGS. 23 through 27 are sectional views of Embodiment 1 for a method for fabricating a GaN based III-V nitride semiconductor light-emitting device according to the present invention.

Referring to FIG. 23, a first compound semiconductor layer 202 is formed on a high-resistant substrate 200. The high-resistant substrate 200 is formed of an etch-resistant substrate, and preferably a sapphire substrate. The first compound semiconductor layer 202 is formed of a GaN based III-V nitride compound semiconductor layer, and preferably a direct transition type compound semiconductor layer. An indirect transition type compound semiconductor layer can be used for the first compound semiconductor layer 202. The direct transition type compound semiconductor layer is preferably an n-type GaN layer. The first compound semiconductor layer 202 may be formed of an updoped GaN based compound semiconductor layer, for example, an undoped GaN layer, InGaN, or AlGaN layer. The active layer 204 is formed of, preferably, a GaN based III-V nitride compound semiconductor layer having, more preferably, a MQW structure. Most preferably, the active layer 204 is formed of an $In_xAl_yGa_{1-x-y}N$ layer (where $0 \leq x \leq 1$, $0 \leq y \leq 1$, and $x+y \leq 1$). A second compound semiconductor layer 206 and a light-transmitting conductive layer 208 through which light generated in the active layer 204 passes are sequentially formed on the active layer 204. The second compound semiconductor layer 206 is preferably formed of the same material layer as the first compound semiconductor layer but doped with p-type impurities. The second compound semiconductor layer 206 is formed of, for example, a p-type GaN layer. Like the first compound semiconductor layer 202, the second compound semiconductor layer 206 may be formed of an updoped material layer. In this case, the second compound semiconductor layer 206 is formed of the same material layer as the first compound semiconductor layer 202. The light-transmitting conductive layer 208 is used as an upper electrode.

Figure 24:
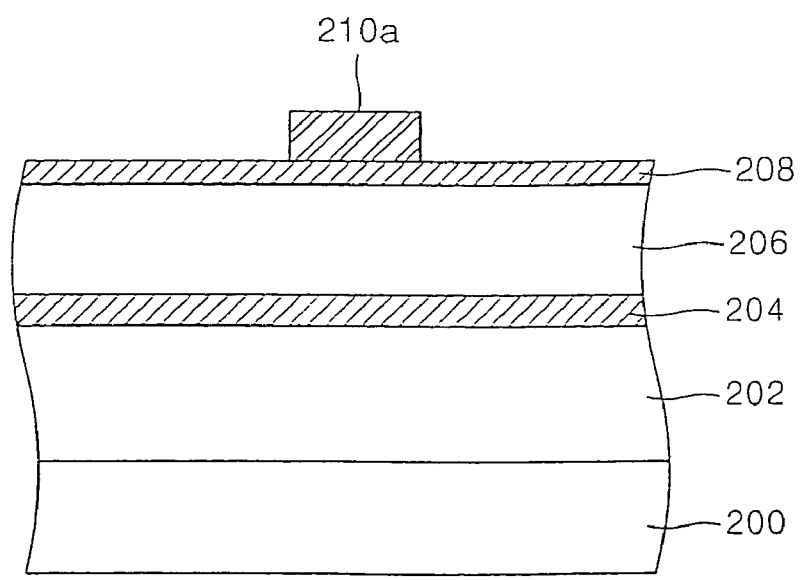

A photosensitive layer (not shown) is deposited on the light-transmitting conductive layer 208 and patterned into a photosensitive pattern 212 through which a region of the light-transmitting conductive layer 208 in which a pad layer is to be formed is exposed. The photosensitive pattern 212 is formed of a photoresist pattern. A pad conductive layer 210 is formed on the photosensitive pattern 212 to cover the exposed region of the light-transmitting conductive layer 208. Next, the photosensitive pattern 212 is removed. During removal of the photosensitive pattern 212, the pad conductive layer 212 on the photosensitive pattern 212 is also removed. Chemicals used to ash and strip the photosensitive pattern 212 do not affect the pad conductive layer 210 formed on the light-transmitting layer 208. After the removal of the photosensitive pattern 212, only a pad conductive pattern 210a remain on the light-transmitting conductive layer 208, as shown in FIG. 24. Hereinafter, the pad conductive pattern 210a will be referred to as a pad layer 201a. The pad layer 210a is used for bonding the light-transmitting conductive layer 208 in a package process.

Figure 25:
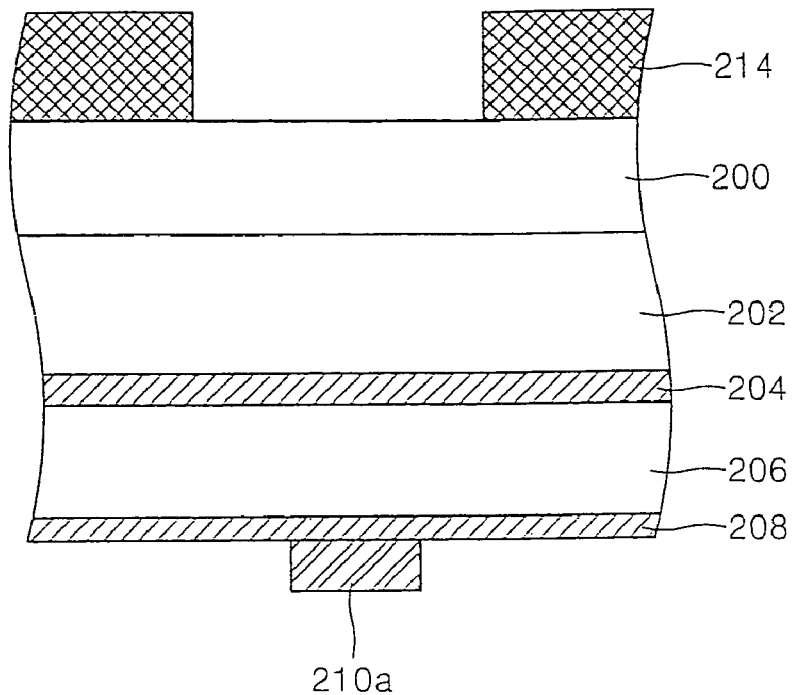

Referring to FIG. 25, the resultant structure on which the pad layer 201a is formed is inverted such that the bottom of the high-resistant substrate 200 faces up. The entire bottom surface of the high-resistant substrate 200 is subjected to grinding, lapping, and polishing. Next, a mask layer (not shown) is formed on the bottom of the high-resistant substrate 200. The mask layer may be a soft or hard mask layer. Preferably, the soft mask is formed of a photoresist layer, and the hard mask layer is formed of a silicon oxide layer or a metal layer such as a nickel (Ni) layer. The mask layer is patterned into a mask pattern 214 through which a region to be a via hole at the bottom of the high-resistant substrate 200 is exposed. The exposed region of the bottom of the high-resistant substrate 200 is etched using the mask pattern 214 as an etch mask until the first compound semiconductor layer 202 is exposed. In this case, the high-resistant substrate 200 is dry etched using $Cl_2$ or $BCl_3$ gases as a reactant gas. The reactant gas used in the dry etching process may additionally include argon (Ar) gas.

In the following embodiments, a description of dry etching applied to a high-resistant substrate will be omitted.

Figure 26:
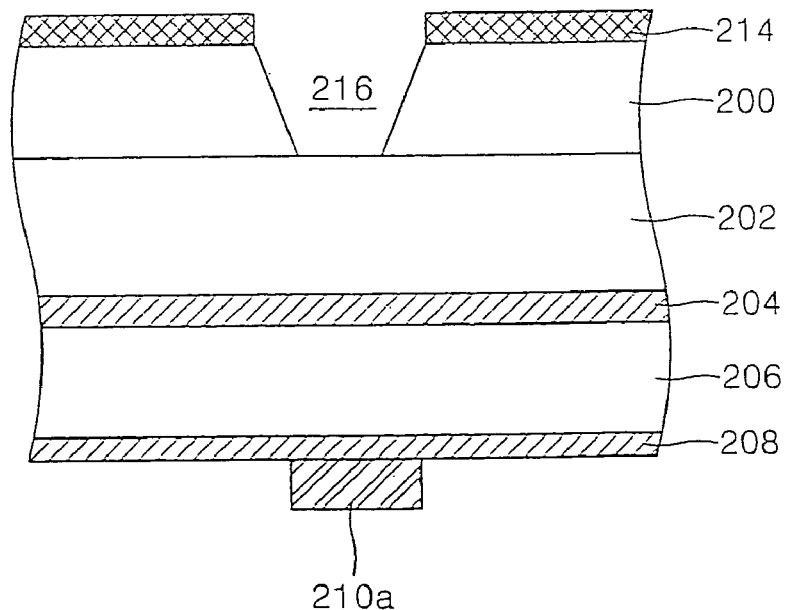

Referring to FIG. 26, by etching the high-resistant substrate 200, a via hole 216 through which the bottom of the first compound semiconductor layer 202 is exposed is formed in the high-resistant substrate 200. Next, the mask pattern 214 is removed.

Figure 27:
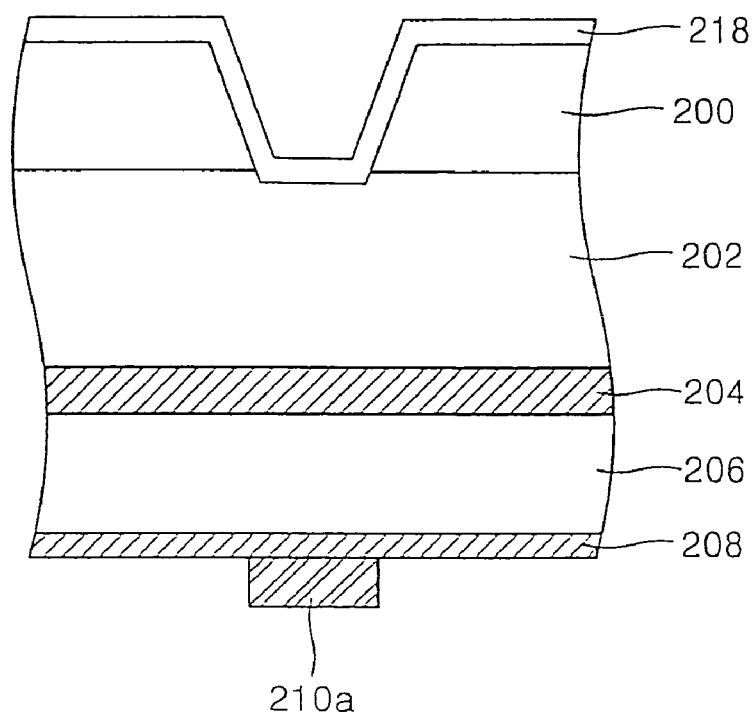

Referring to FIG. 27, a conductive layer 218 is formed on the bottom of the high-resistant substrate 200 in which the via hole 216 is formed, and preferably, in contact with the bottom of the first compound semiconductor layer 202 which is exposed through the via hole 216. The conductive layer 216 is used as a lower electrode. Because the high-resistant substrate 200 is resistant against etching, the via hole 261 formed by etching has a gently slopping sidewall, thereby improving step coverage with the conductive layer 218. As a result, the conductive layer 218 is formed to have a uniform thickness.

As a result, a top-emitting type light-emitting diode is obtained in which the via hole 216 exposing the bottom of the first compound semiconductor layer 202 is formed in the high-resistant substrate 200 on which the light-transmitting conductive layer 208 used as the upper electrode, the conductive layer 218 used as the lower electrode, the active layer 204, the first and second compound semiconductor layers 202 and 206, and the pad layer 210a are formed.

Embodiment 2

Figure 28:
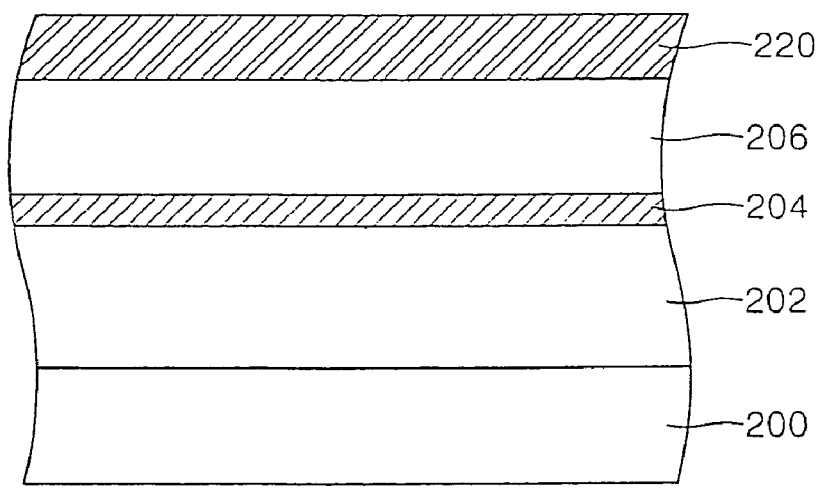
FIGS. 28 and 29 are sectional views of Embodiment 2 for the method for fabricating a GaN based III-V nitride semiconductor light-emitting device according to the present invention.

Referring to FIG. 28, a first compound semiconductor layer 202, an active layer 204, and a second compound semiconductor layer 206 are sequentially formed on a high-resistant substrate 200. Descriptions of the first compound semiconductor layer 202, the active layer 204, and the second compound semiconductor layer 206 are omitted here, because they are the same as those described in Embodiment 1. A conductive layer 220 is formed on the second compound semiconductor layer 206. Here, the conductive layer 220 is used as an upper electrode and preferably has a thickness sufficient to shield light generated in the active layer 204.

Figure 29:
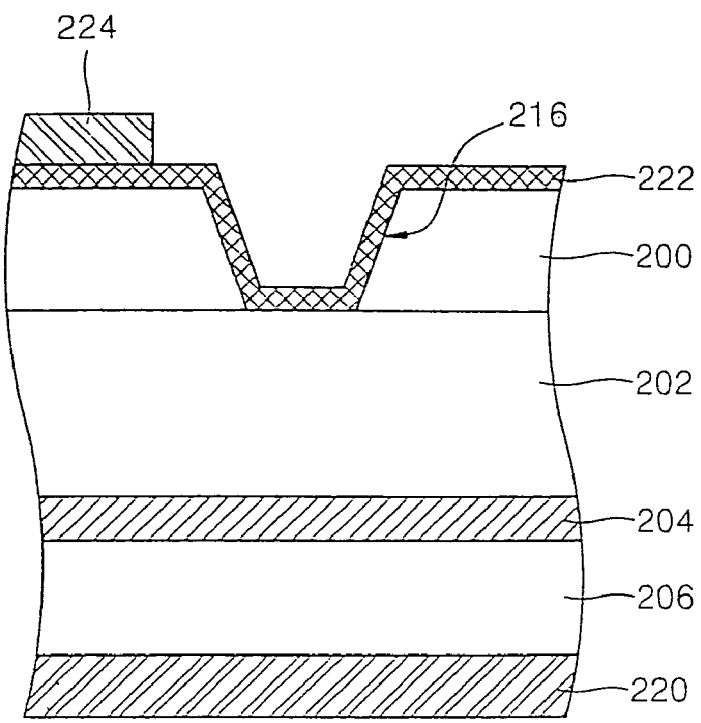

As described in Embodiment 1, the resultant structure is inverted such that the bottom of the high-resistant substrate 200 faces up, as shown in FIG. 29. Next, a via hole 216 is formed in the high-resistant substrate 200 so that the bottom of the first compound semiconductor layer 202 is exposed through the via hole 216. Next, a light-transmitting conductive layer 222 is formed on, and preferably fully, the bottom of the high-resistant substrate 200 in contact with the exposed portion of the first compound semiconductor layer 202. The light-transmitting conductive layer 222 is used as a lower electrode. A pad conductive layer (not shown) is formed on the light-transmitting conductive layer 222 and patterned into a pad layer 224. The pad layer 224 is used for bonding of the light-transmitting conductive layer 222 in a package process.

As a result, a light-emitting diode is obtained in which the via hole 216 exposing the bottom of the first compound semiconductor layer 202 is formed in the high-resistant substrate 200 as in Embodiment 1. Unlike the light-emitting diode of Embodiment 1, the light-emitting diode of Embodiment 2 is a bottom-emitting type in which the lower electrode formed on the bottom of the high-resistant substrate 200 in contact with the bottom of the first compound semiconductor layer 202 is transparent, and the pad layer 224 is formed on the bottom of the lower electrode.

Embodiment 3

The present embodiment relates to a method for fabricating a top-emitting type light-emitting diode as in Embodiment 1. However, the processes following the etching of the high-resistant substrate 200 differ from Embodiment 1. The processes up to grinding, lapping, and polishing of the bottom of the high-resistant substrate 200 are performed according to Embodiment 1.

Figure 30:
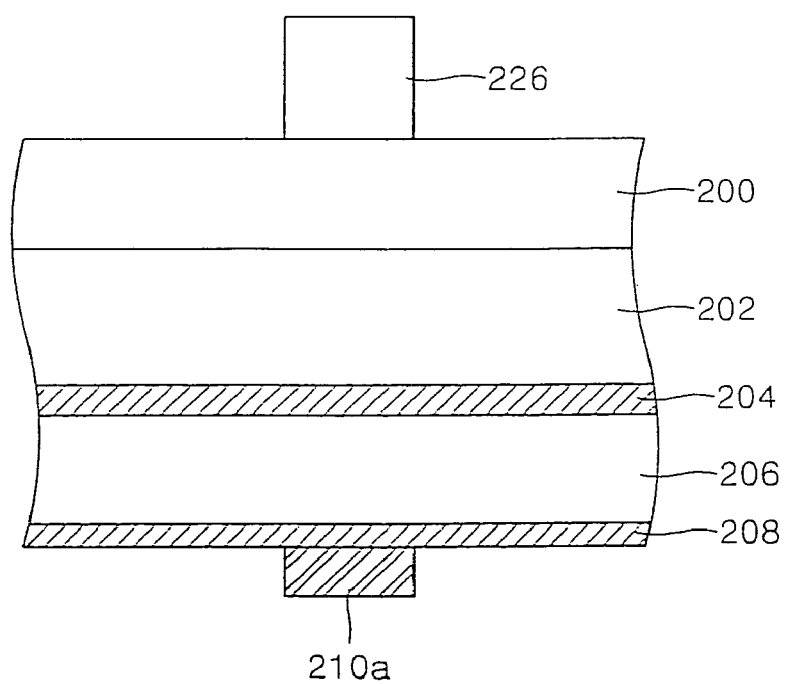
FIGS. 30 through 32 are sectional views of Embodiment 3 for the method for fabricating a GaN based III-V nitride semiconductor light-emitting device according to the present invention.

Next, as shown in FIG. 30, a mask pattern 226, which covers only a predetermined region of the high-resistant substrate 200 and exposes the remaining portion, is formed on the bottom of the high-resistant substrate 200. It is preferable that the mask pattern 226 is formed at the bottom center of the high-resistant substrate 200. The entire exposed region of the high-resistant substrate 200 is etched using the mask pattern 226 as an etch mask until the bottom of the first compound semiconductor layer 202 is exposed.

Figure 31:
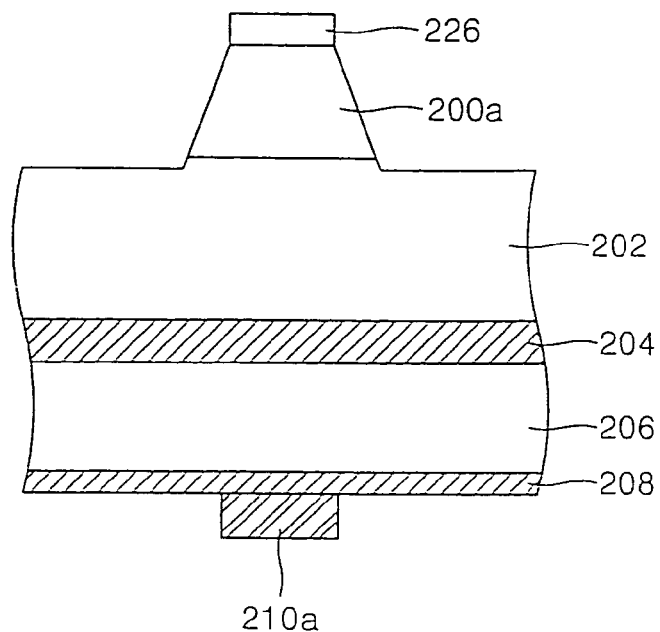

Referring to FIG. 31, as a result of etching to the bottom of the high-resistant substrate 200, but not the center region thereof, a high-resistant substrate pattern 200a remains on the bottom center of the first compound semiconductor layer 202 so that the bottom of the first compound semiconductor layer 202, except for a region protected by the high-resistant substrate pattern 200a, is exposed. The exposed region of the first compound semiconductor layer 202 is removed by a predetermined thickness during the etching process. Due to the etch-resistance of the high-resistant substrate 200, the sidewall of the high-resistant substrate pattern 200a has a positive slope. In other words, the area of a region of the high-resistant substrate pattern 200a covered by the mask pattern 226 is smaller than that of a region of the high-resistant substrate pattern 200a in contact with the first compound semiconductor layer 202.

Figure 32:
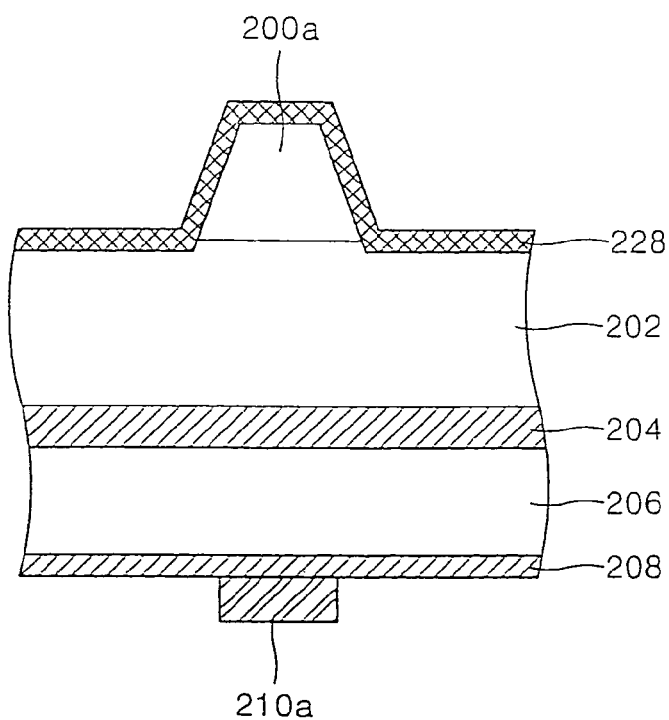

After removing the mask pattern 226, a conductive layer 118 is formed on the bottom of the first compound semiconductor layer 220, which is exposed by etching, to cover the high-resistant substrate pattern 200a, as shown in FIG. 32. The conductive layer 228 is used as a lower electrode.

As a result, a top-emitting type light-emitting diode is obtained in which the high-resistant substrate pattern 200a is in contact with the bottom center of the first compound semiconductor layer 202, and the light-reflecting lower electrode 228 is formed in contact with the bottom of the first compound semiconductor layer 202 surrounding the high-resistant substrate pattern 200a.

Embodiment 4

The present embodiment is a combination of the features of the light-emitting diode fabrication methods according to Embodiments 2 and 3.

Figure 33:
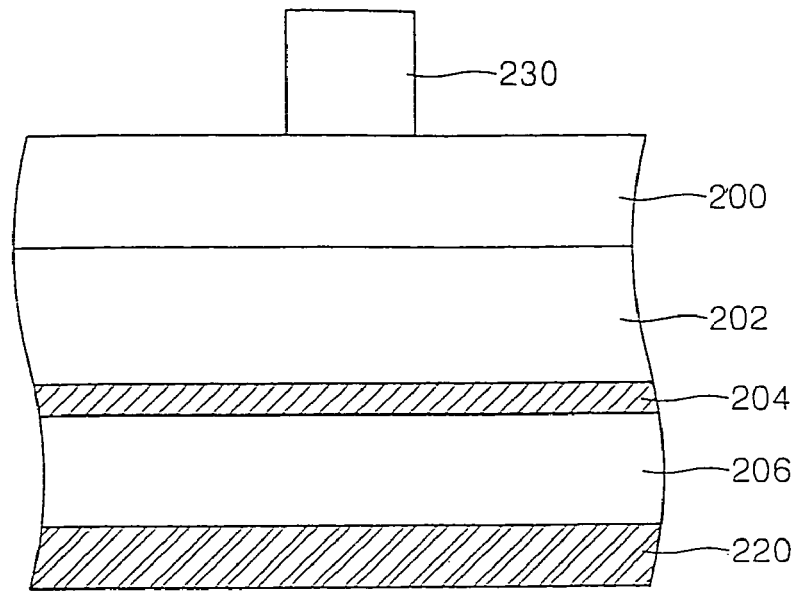
FIGS. 33 and 34 are sectional views of Embodiment 4 for the method for fabricating a GaN based III-V nitride semiconductor light-emitting device according to the present invention.
Figure 34:
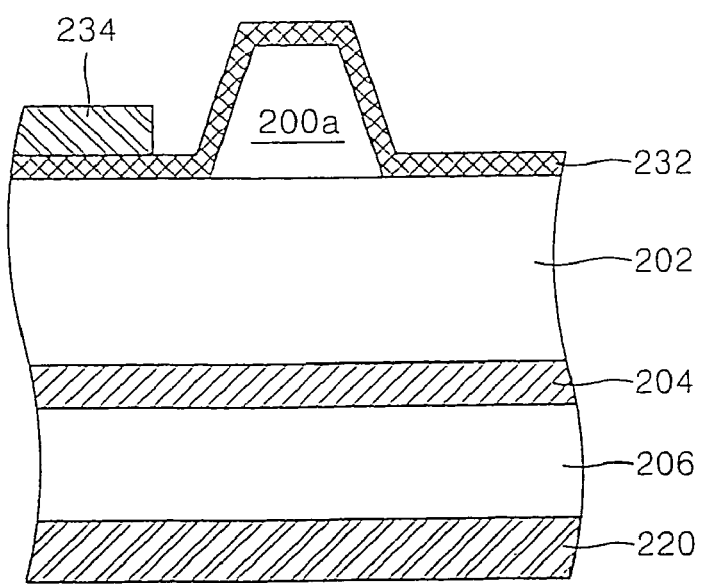

In particular, the processes up to polishing the bottom of the high-resistant substrate 200 are performed according to the method of Embodiment 2. Next, as shown in FIG. 33, a mask pattern 230 for use in forming a high-resistant substrate pattern 200a shown in FIG. 34 is formed on the bottom of the high-resistant substrate 200. The bottom of the high-resistant substrate 200, which is exposed through the mask pattern 240, is etched using the mask pattern 230 as an etch mask, and the mask pattern 230 is removed. As a result, the high-resistant substrate pattern 220a, as described in Embodiment 3, remains on the bottom center of the first compound semiconductor layer 202. A light-transmitting conductive layer 232 that is transparent with respect to light emitted from in the active layer 204 is formed on the bottom of the first compound semiconductor layer 202 to cover the high-resistant substrate pattern 220a. The light-transmitting conductive layer 232 is used as a lower electrode. A pad conductive layer (not shown) is formed over the light-transmitting conductive layer 232 and patterned into a pad layer 234. The pad layer 234 can be formed in any region of the light-transmitting conductive layer 232, but preferably in a region on the bottom of the high-resistant substrate pattern 200a in consideration of convenience in bonding.

As a result, a bottom-emitting type light-emitting diode is obtained in which the high-resistant substrate pattern 200a is in contact with the bottom center of the first compound semiconductor layer 202, and the light-transmitting lower electrode 232 is formed in contact with the bottom of the first compound semiconductor layer 202 surrounding the high-resistant substrate pattern 200a.

Embodiment 5

Figure 35:
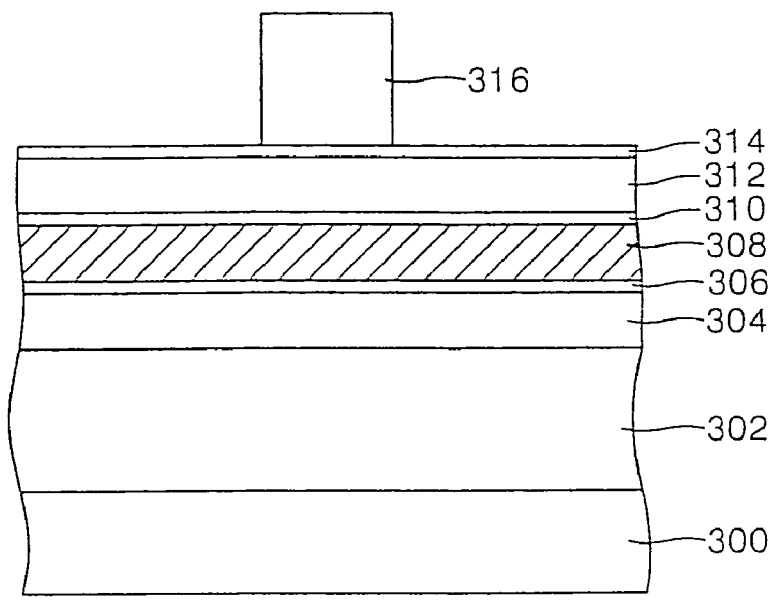
FIGS. 35 through 40 are sectional views illustrating a method for fabricating the GaN based III-V nitride semiconductor laser diode shown in FIG. 17.

The present embodiment relates to a method for fabricating the semiconductor laser diode of Embodiment 13. FIG. 35 illustrates a process of sequentially forming material layers for lasing in a high-resistant substrate.

In particular, referring to FIG. 35, a first compound semiconductor layer 302, a first cladding layer 304, a first waveguide layer 106, an active layer 308, a second waveguide layer 310, a second cladding layer 312, and a second compound semiconductor layer 314 are sequentially formed on a high-resistant substrate 300. The active layer 308 and the first and second waveguide layers 306 and 310 form a resonator layer for lasing. It is preferable that the high-resistant substrate 300 is an etch-resistant sapphire substrate. Both the first and second compound semiconductor layers 302 and 314 are formed of a GaN based III-V nitride compound semiconductor layer, preferably a direct transition type compound layer, and most preferably an n-type GaN layer and p-type GaN layer, respectively. An indirect transition type GaN based III-V nitride compound semiconductor layer can be used for the first and second compound semiconductor layers 302 and 314 without limitation to the type of transition. Alternatively, the first and second compound semiconductor layers 302 and 314 may be formed of an undoped GaN layer or an InGaN or AlGaN layer in which Al or In is contained in a predetermined ratio. The materials for the first and second compound semiconductor layers 302 and 304 are not limited to GaN based materials and nitrides.

The active layer 308 is formed of, preferably, a GaN based III-V nitride compound semiconductor layer having, more preferably, a MQW structure. Most preferably, the active layer 308 is formed of an $In_xAl_yGa_{1-x-y}N$ layer (where $0 \leq x \leq 1$, $0 \leq y \leq 1$, and $x+y \leq 1$). The first and second cladding layers 304 and 314 have refractive indexes smaller than the first and second waveguide layers 306 and 310, respectively, and also smaller than the active layer 308. Preferably, the first cladding layer 304 is formed of an n-type AlGaN/GaN layer, and the second cladding layer 310 is formed of a p-type AlGaN/GaN layer. The first and second waveguide layers 106 and 310 are formed of material layers whose refractive indexes are greater than the first and second cladding layers 304 and 312, respectively, and preferably GaN based III-V nitride compound semiconductor layers. More preferably, the first and second waveguide layers 306 and 310 are formed of an n-type GaN layer and a p-type GaN layer, respectively. The first and second waveguide layers 306 and 310 fully reflect only a light emitted from the active layer 308 in a direction perpendicular to the axis of the resonator layer towards the active layer 308 along with the first and second cladding layers 304 and 312, respectively, to confine the light to the active layer 308. To this end, preferably, the active layer 308 is formed of a material whose refractive index is greater than the first and second waveguide layers 306 and 310. The active layer 308 is a material layer in which substantial lasing occurs. The active layer 308 is formed of, preferably, a GaN based III-V nitride compound semiconductor layer, and more preferably, an InGaN layer in which In is contained in a predetermined ratio. The active layer 308 may be formed of any III-V compound semiconductor material layer other than GaN based material layers. In this case, the first and second waveguide layers 306 and 310, the first and second cladding layers 304 and 312, and the first and second compound semiconductor layers 302 and 314 are formed of other material layers having properties matching well with the active layer 308.

Next, a photosensitive layer (not shown) is deposited on the second compound semiconductor layer 314 and patterned into a photosensitive pattern 316 covering a predetermined region of the second compound semiconductor layer 314. The photosensitive pattern 316 is a mask pattern for use in patterning the second clad layer 312 into a ridge form.

Figure 36:
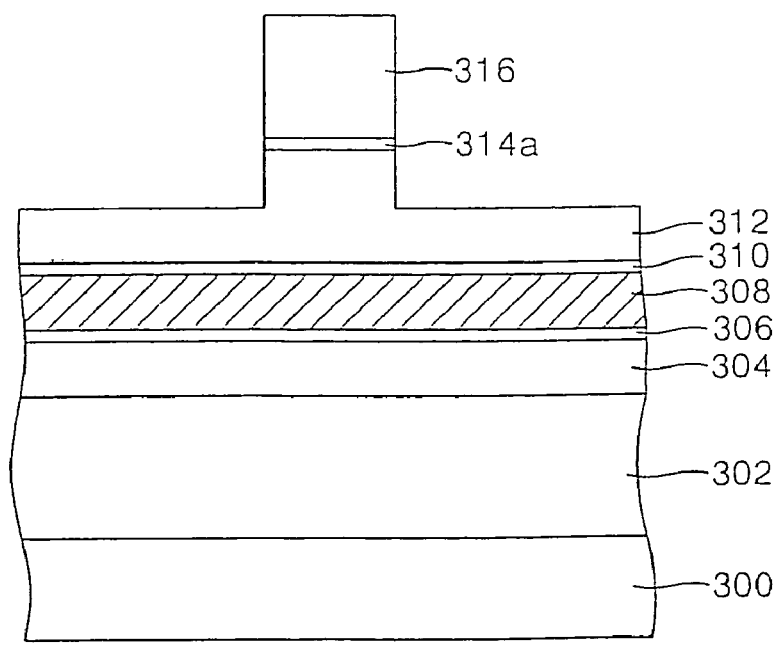

Referring to FIG. 36, using the photosensitive pattern 316 as an etch mask, an exposed region of the second compound semiconductor layer 314 is etched and then an exposed region of the second cladding layer is etched by a predetermined thickness. As a result, the second cladding layer 312 becomes to have a ridge (or rib) structure in which the center of the second cladding layer 312 above which the photosensitive pattern 316 is formed is relatively thick, and the peripheral region other than the center of the second cladding layer 312 is relatively thin. A second compound semiconductor pattern 314a remains on the ridge of the second cladding layer 312.

Figure 37:
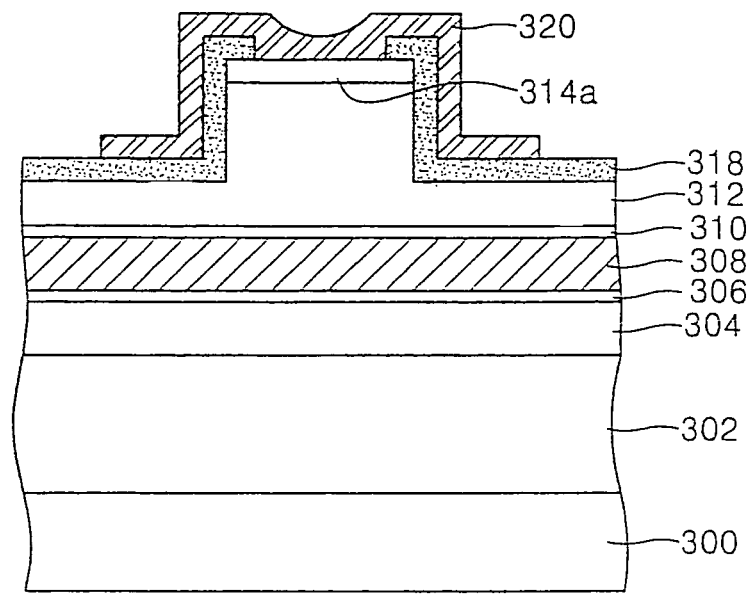

After removing the photosensitive pattern 316, as shown in FIG. 37, a passivation layer 318 is formed over the cladding layer 312 having the ridge structure and patterned to expose a region, preferably the center, of the second compound semiconductor pattern 314a. As a result, the passivation layer 318 is formed on the second cladding layer 312 symmetrically around and in contact with the second compound semiconductor pattern 314a. A conductive layer 320 is formed on the passivation layer 318 in contact with the exposed region of the second compound semiconductor pattern 314a. The conductive layer 3120 is used as an upper electrode.

Figure 38:
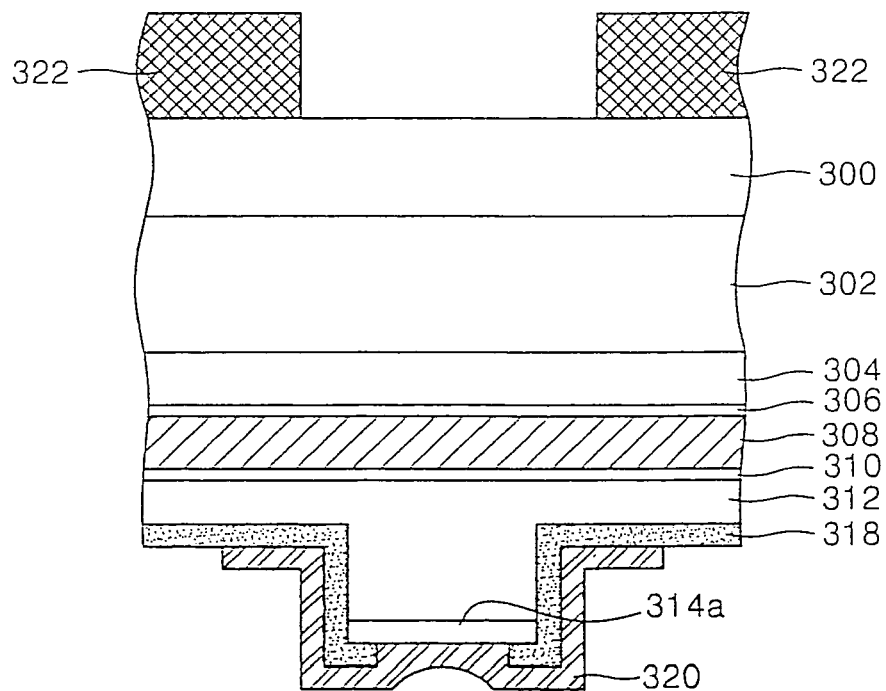

Referring to FIG. 38, after forming the conductive layer 320, the resultant structure is inverted such that the bottom of the high-resistant substrate 300 faces up. Next, the bottom of the high-resistant substrate 300 is subjected to grinding, lapping, and polishing to reduce the thickness of the high-resistant substrate 300 to an extent where the device can still be supported. A mask layer (not shown) is formed on the polished bottom of the high-resistant substrate 300. The mask layer is formed of a photoresist layer, a silicon oxide layer, or a metal layer such as a nickel layer. The mask layer is patterned into a mask pattern 322 exposing a region to be a via hole at the bottom of the high-resistant substrate 300. The exposed region of the high-resistant substrate 300 is etched using the mask pattern 322 as an etch mask until the bottom of the first compound semiconductor layer 302 is exposed.

Figure 39:
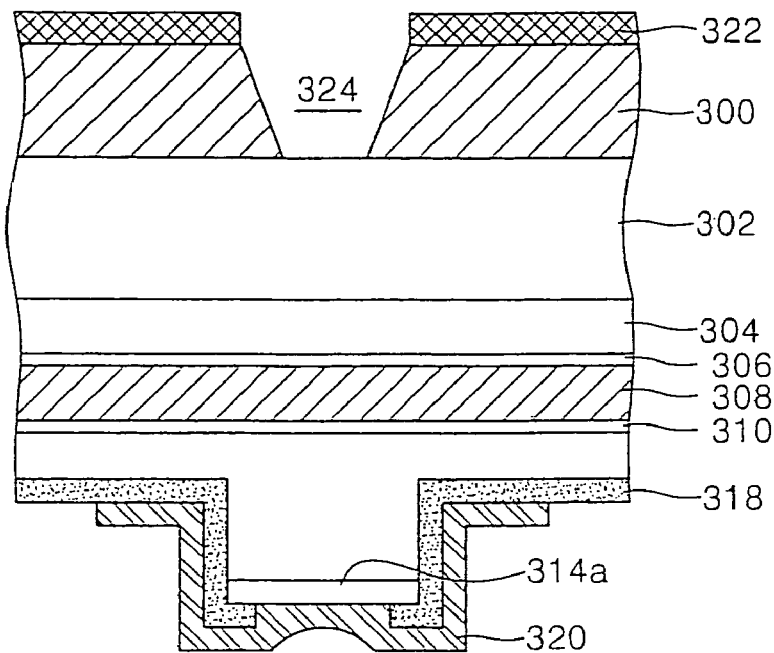
Figure 40:
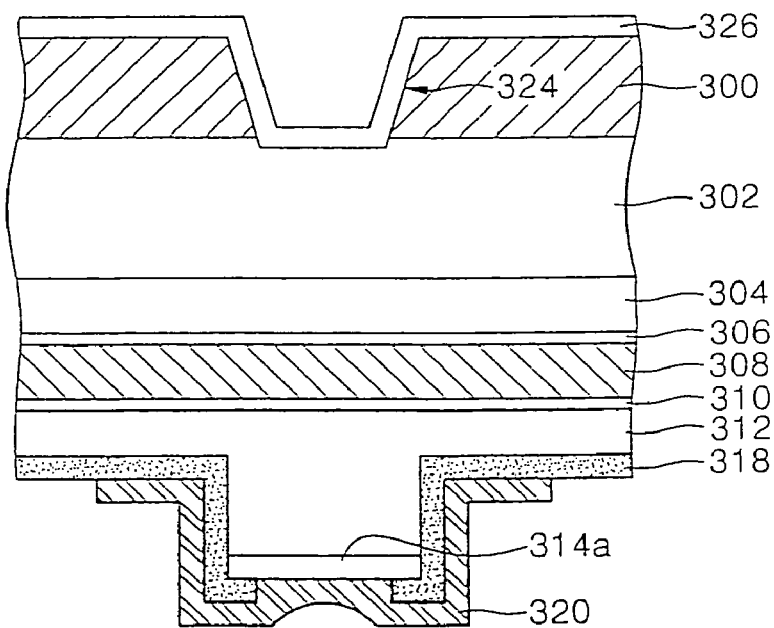

As a result, a via hole 324 exposing a region of the bottom of the first compound semiconductor layer 302 is formed in the high-resistant substrate 300, as shown in FIG. 39. After removing the mask pattern 322 (this removal of the mask pattern 322 is not necessary if the mask pattern 322 is a hard mask pattern such as a silicon oxide pattern or metal patter), as shown in FIG. 40, a conductive layer 326 is formed on the bottom of the high-resistant substrate 300, and preferably the entire region of the high-resistance substrate 300 exposed through the via hole 324, in contact with the bottom of the first compound semiconductor layer 302 exposed through the via hole 324. Although not illustrated in FIG. 40, the conductive layer 326 may be formed of multiple layers. For example, an ohmic contact layer (denoted by reference numeral 80 in FIG. 19 or 21) may be formed on the bottom of the high-resistant substrate 300 in contact with the bottom of the first compound semiconductor layer 302 exposed through the via hole 324 and then a thermal conductive layer (denoted by reference numeral 76 in FIG. 19 or 21) may be formed on the ohmic contact layer. The conductive layer 326 is used as a lower electrode. If there is no need to consider heat generated during a lasing process, the conductive layer 326 can be formed to fill the via hole 324.

As a result, a laser diode is obtained in which the material layers for lasing are formed between electrodes facing each other and the lower electrode is formed in contact with the material layer for lasing through the via hole formed in the high-resistant substrate.

Embodiment 6

The present embodiment relates to a method for fabricating the semiconductor laser diode of Embodiment 14. In the present embodiment, the processes up to polishing the bottom of the high-resistant substrate 300 are performed according to Embodiment 5.

Figure 41:
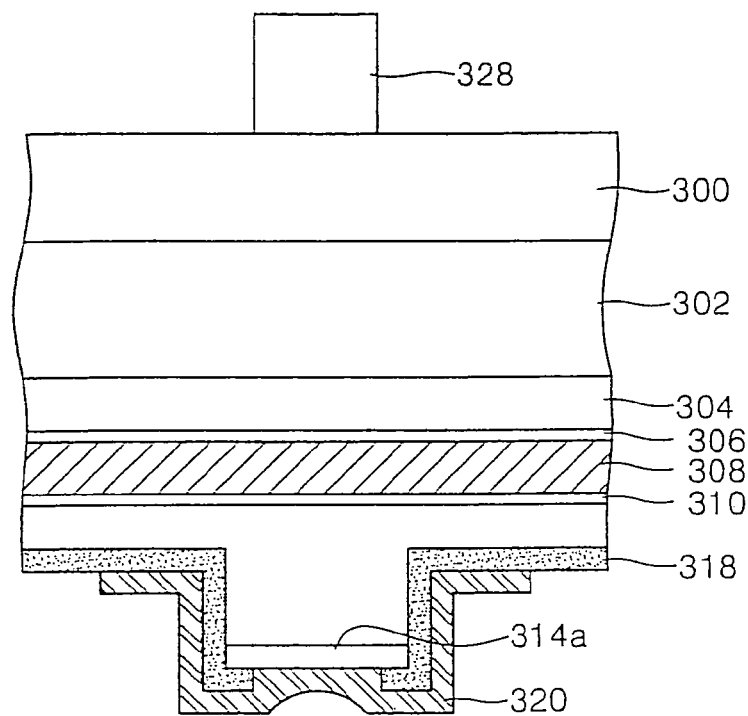
FIGS. 41 through 43 are sectional views illustrating a method for fabricating the GaN based III-V nitride semiconductor laser diode shown in FIG. 18 according to the present invention.
Figure 42:
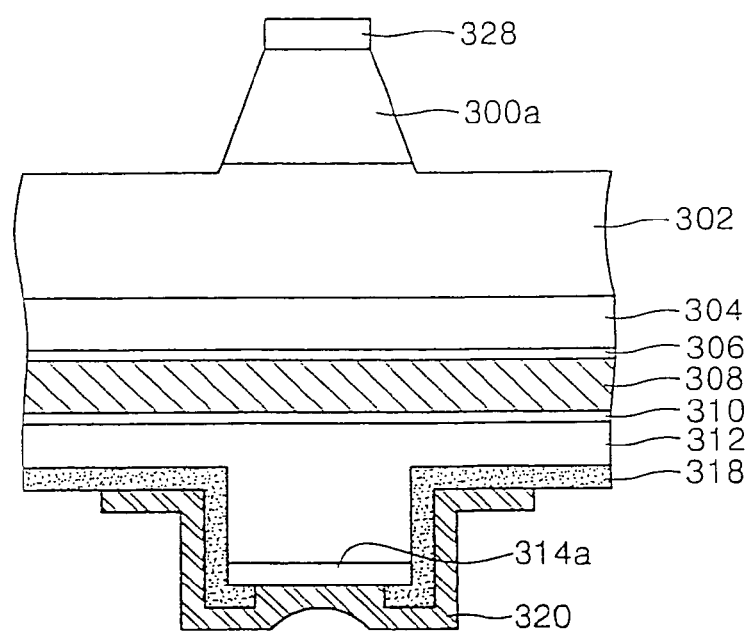

Referring to FIG. 41, a mask pattern 328 is formed on the bottom of the high-resistant substrate 300 to cover a predetermined region, preferably, the center, of the bottom of the high-resistant substrate 300 and expose the remaining region. The exposed region of the high-resistant substrate 300 is etched using the mask pattern 328 as an etch mask until the bottom of the first compound semiconductor layer 302 is exposed. As a result, a high-resistant substrate pattern 300a covering a predetermined region, preferably, the center, of the bottom of the first compound semiconductor layer 302 remains, and the bottom of the first compound semiconductor layer 302 is exposed around the high-resistant substrate pattern 300a, as shown in FIG. 42.

Figure 43:
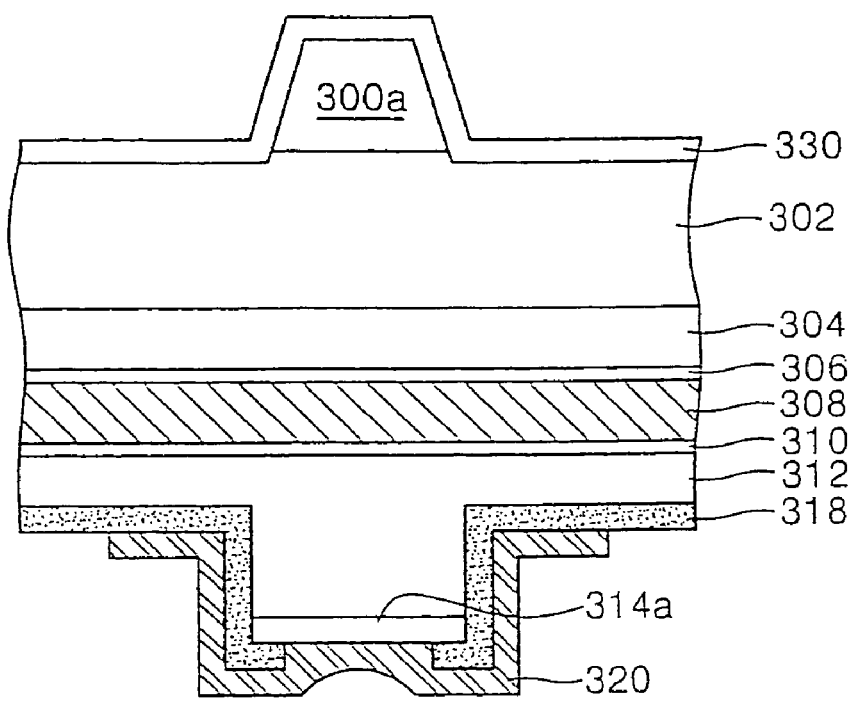

After removing the mask pattern 328, a conductive layer 330 is formed on the exposed region of the first compound semiconductor layer 302 to cover fully the high-resistant substrate pattern 300a, as shown in FIG. 43. The conductive layer 330 is used as an upper electrode. Because the sidewall of the high-resistant substrate pattern 300a has a positive slope, the conductive layer 300 having an even thickness can be formed. The conductive layer 330 may be formed of multiple layers, as in Embodiment 5 relating to the laser diode fabricating method.

As a result, a laser diode is obtained in which the material layers for lasing are formed between the electrodes facing each other, and the lower electrode is formed in contact with the material layers for lasing and to cover the high-resistant substrate pattern.

Alternatively, in forming the via hole 332 in the high-resistant substrate 300 to expose the bottom of the first compound semiconductor layer 302, separation of the light-emitting device also can be performed. This etching process can be applied in the embodiments of light-emitting device fabrication where a via hole is formed in the high-resistant substrate 300.

Figure 44:
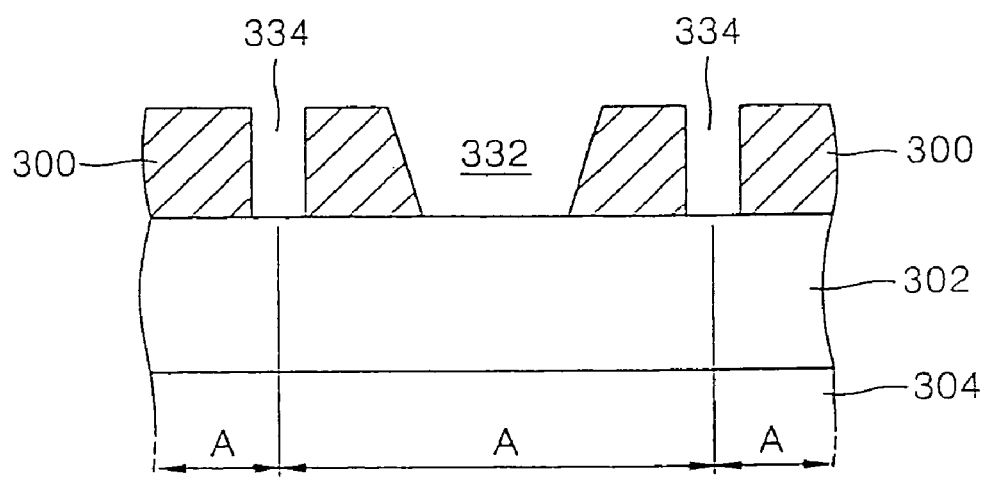
FIG. 44 is a sectional view illustrating one common step in the manufacture of GaN based III-V nitride semiconductor light-emitting devices according to the present invention.

In particular, as shown in FIG. 44, in forming the via hole 332 in the high-resistant substrate 300, at the same time a trench 334 for device isolation can be formed in the boundary region between light-emitting devices. By doing so, a separate diamond cutting process for device isolation is not necessary, and the light-emitting devices can be separated by pushing the opposite side to the side where the trench 334 is formed. In FIG. 44, reference character A denotes a region where a light-emitting diode is formed.

While this invention has been particularly shown and described with reference to preferred embodiments thereof, the preferred embodiments described above are merely illustrative and are not intended to limit the scope of the invention. For example, it will be appreciated by one skilled in the art that a protective layer for the structure formed on the high-resistant substrate may be formed prior to polishing the bottom of the high-resistant substrate. Also, the structure of a light emitting material layer or material layers for lasing may be varied. For a laser diode, the structure between the active layer and the upper electrode may have a shape other than the ridge. The sprit of the present invention can be extended to refractive index-adjusted waveguiding laser diodes as well as gain-adjusted waveguiding laser diodes. It will be understood by those skilled in the art that various changes in form and details may be made therein without departing from the spirit and scope of the invention as defined by the appended claims.

As described above, the two electrodes in a light-emitting device according to the present invention are arranged to face each other around the light-emitting region. For example, the two electrodes are aligned vertically with the light emitting region therebetween. Therefore, bonding with only wire is enough in a packaging step, thereby simplifying the process with reduced time consumption. In addition, one electrode is not formed in a deeply etched region as in the conventional art so that bonding failure is reduced with increased yield. Unlike the conventional art in which formation of an electrode pattern is followed by deep etching to expose an n-type GaN layer, an electrode is formed on the bottom of the substrate, thereby simplifying the photolithography and the overall device fabricating process. The laser diode according to the present invention includes on the bottom of the substrate a material layer having excellent thermal conductivity in contact with the n-type material layer so that heat generated in the active layer during laser emission can be dissipated effectively without performing the conventional flip-chip bonding process. Therefore, according to the present invention, degradation in device characteristics can be prevented with reduced processing time (¼ reduction with respect to the conventional method) and increased yield.

What is claimed is:
1. A method for fabricating a light-emitting device, the method comprising:
 (a) sequentially forming a first compound semiconductor layer, an active layer, and a second compound semiconductor layer, for inducing light emission, on a high-resistant substrate;

(b) forming a light-transmitting conductive layer on the second compound semiconductor layer;

(c) forming at least a via hole by dry etching a part of the high-resistant substrate and the first compound semiconductor layer using a reaction gas comprising at least $Cl_2$ or $BCl_3$, wherein the depth of the via hole is shallower than a sum of the thickness of the high-resistant substrate and the first compound semiconductor layer; and (d) forming a light-shielding conductive layer to cover the exposed region of the first compound semiconductor layer, such that the light-shielding conductive layer reflects the light emitted from the active layer upwardly, wherein the dry etching of portions of the high-resistant substrate and the first compound semiconductor layer is performed in a single process.

2. The method of claim 1, wherein the reaction gas further comprises argon (Ar).

3. The method of claim 1, wherein the high-resistant substrate is a sapphire substrate.

4. The method of claim 1, wherein the light-shielding conductive layer covers the surface of the high-resistant substrate.

5. The method of claim 1, wherein the light-shielding conductive layer is formed of a material selected from the group consisting of Au, Ag, Pt, Cu, Ni, In, or an alloy thereof.

* * * * *